US012663489B2

(12) United States Patent
Motovilova et al.

(10) Patent No.: US 12,663,489 B2
(45) Date of Patent: Jun. 23, 2026

(54) SELF-TUNING LIQUID METAL RF COIL AND COIL ARRAY FOR MRI

(71) Applicant: CORNELL UNIVERSITY, Ithaca, NY (US)

(72) Inventors: Elizaveta Motovilova, Ithaca, NY (US); Simone Angela Winkler, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 100 days.

(21) Appl. No.: 18/286,294

(22) PCT Filed: Apr. 28, 2022

(86) PCT No.: PCT/US2022/026765
§ 371 (c)(1),
(2) Date: Oct. 10, 2023

(87) PCT Pub. No.: WO2022/232416
PCT Pub. Date: Nov. 3, 2022

(65) Prior Publication Data
US 2024/0192296 A1     Jun. 13, 2024

Related U.S. Application Data

(60) Provisional application No. 63/181,664, filed on Apr. 29, 2021.

(51) Int. Cl.
*G01R 33/34*      (2006.01)
*G01R 33/36*      (2006.01)

(52) U.S. Cl.
CPC ... *G01R 33/34084* (2013.01); *G01R 33/3628* (2013.01)

(58) Field of Classification Search
None
See application file for complete search history.

(56) References Cited

U.S. PATENT DOCUMENTS 5,276,398 A      1/1994  Withers et al.
5,351,007 A  *   9/1994  Withers ........... G01R 33/34053
505/844

(Continued)

FOREIGN PATENT DOCUMENTS

CN      103796582 A  *  5/2014   ......... G01R 33/3685
CN      114252822 A  *  3/2022   ......... G01R 33/3607

(Continued)

OTHER PUBLICATIONS

Motovilova, E., et al., "Stretchable self-tuning MRI receive coils based on liquid metal technology (LiquiTune)", Sci Rep, 2021, pp. 1-11, vol. 11, No. 16228.

(Continued)

*Primary Examiner* — Richard Isla

(74) *Attorney, Agent, or Firm* — Scully, Scott, Murphy & Presser, P.C.

(57)     ABSTRACT
A single or multiple self-tuning coil element for an MR imaging system is provided. The element is flexible and stretchable and may conform to various body parts and patient sizes. The element may be worn by the patient during the MR imaging session. Each coil may have one or more interdigital capacitors formed of flexible conductive traces. The capacitance of the interdigital capacitor(s) changes under stretching which provides the self-tuning. The traces may be made of liquid metal. The liquid metal may be doped with a contrast agent such that the coil is substantially invisible on an MR image. The coil(s) in a multiple coil element may be arranged in a single or a dual layer.

18 Claims, 35 Drawing Sheets
(28 of 35 Drawing Sheet(s) Filed in Color)

(56) References Cited

U.S. PATENT DOCUMENTS

| | | | | |
|---|---|---|---|---|
| 6,169,399 | B1 * | 1/2001 | Zhang | G01R 33/3635 |
| | | | | 324/309 |
| 6,636,040 | B1 | 10/2003 | Eydelman | |
| 7,619,416 | B2 | 11/2009 | Nordmeyer-Massner et al. | |
| 8,217,653 | B2 | 7/2012 | Vaughan | |
| 8,854,042 | B2 | 10/2014 | Vaughan, Jr. et al. | |
| 9,035,654 | B2 | 5/2015 | Biber et al. | |
| 9,149,205 | B2 | 10/2015 | Hancu et al. | |
| 9,977,100 | B2 | 5/2018 | Crozier et al. | |
| 10,036,789 | B2 | 7/2018 | Yu et al. | |
| 10,274,555 | B2 | 4/2019 | Findeklee et al. | |
| 10,483,645 | B2 | 11/2019 | Erturk et al. | |
| 10,969,447 | B2 * | 4/2021 | Stack | G01R 33/5601 |
| 10,983,185 | B2 * | 4/2021 | Stack | G01R 33/3685 |
| 11,372,062 | B2 * | 6/2022 | Tomiha | G01R 33/34084 |
| 2003/0020553 | A1 * | 1/2003 | Gao | H01P 1/20381 |
| | | | | 331/66 |
| 2005/0200359 | A1 | 9/2005 | Withers | |
| 2008/0180101 | A1 | 7/2008 | Bradshaw et al. | |
| 2018/0329005 | A1 | 11/2018 | Sodickson et al. | |
| 2018/0356483 | A1 | 12/2018 | Zhang et al. | |
| 2019/0154773 | A1 | 5/2019 | Stack et al. | |
| 2019/0219648 | A1 | 7/2019 | Lin et al. | |
| 2019/0293738 | A1 | 9/2019 | Popescu | |
| 2019/0310330 | A1 | 10/2019 | Yang et al. | |
| 2019/0353722 | A1 | 11/2019 | Stormont et al. | |
| 2020/0000810 | A1 | 1/2020 | Yamamoto et al. | |
| 2020/0018808 | A1 | 1/2020 | Ji | |
| 2020/0081081 | A1 | 3/2020 | Yang et al. | |
| 2021/0234265 | A1 * | 7/2021 | Smith | A61N 1/36038 |
| 2024/0004007 | A1 * | 1/2024 | Berendt | A61B 5/6824 |

FOREIGN PATENT DOCUMENTS

| | | | |
|---|---|---|---|
| EP | 2031534 | A1 | 3/2009 |
| JP | H07289535 | A | 11/1995 |
| JP | 2012213581 | A | 11/2012 |
| JP | 2017504185 | A | 2/2017 |
| JP | 2017099502 | A | 6/2017 |
| JP | 2020500073 | A | 1/2020 |
| JP | 2021069754 | A | 5/2021 |
| KR | 20210054677 | A | 5/2021 |
| WO | 2018003527 | A1 | 1/2018 |
| WO | WO-2018098255 | A1 * | 5/2018 ......... G01R 33/3628 |
| WO | 2020232021 | A1 | 11/2020 |
| WO | 2022232416 | A1 | 11/2022 |

OTHER PUBLICATIONS

International Search Report dated Aug. 12, 2022 received in International Application No. PCT/US2022/26765.

Mehmann, A. et al., "Automatic Resonance Frequency Retuning of Stretchable Liquid Metal Receive Coil for Magnetic Resonance Imaging", IEEE Transactions on Medical Imaging, 2018, pp. 1420-1426, vol. 38, No. 6.

Ruytenberg, T. et al., "Shielded-coaxial-cable coils as receive and transceive array elements for 7T human MRI", Magn Reson Med., 2019, pp. 1-12.

Corea, J. et al., "Screen-printed flexible MRI receive coils", Nature Communications, 2016, pp. 1-7.

Extended European search report dated Jan. 23, 2025 received in European Patent Application No. 22796741.1.

Su, S., "Distributed capacitance method in RF coils—the advantages and potential", Proceedings of the International Society for Magnetic Resonance in Medicine, 2007, p. 3255.

Varga, M. et al., "Adsorbed Eutectic GaIn Structures on a Neoprene Foam for Stretchable MRI Coils", Advanced Materials, 2017, pp. 1-7, vol. 29, No. 44.

Motovilova, E, et al., "Self-tuning stretchable RF receive coil concept using liquid metal encapsulated within an elastic polymer", Proceedings of The 2021 ISMRM & Smrt Annual Meeting & Exhibition, Apr. 2021, pp. 1-4, No. 136.

Motovilova, E, et al., "MRI Coils Less Visible in MR images", Proceedings of the Joint Annual Meeting, Apr. 2022, pp. 1-6, No. 4106.

Notice of Reasons for Refusal dated Mar. 31, 2026 received in Japanese Patent Application No. 2023-566456.

* cited by examiner

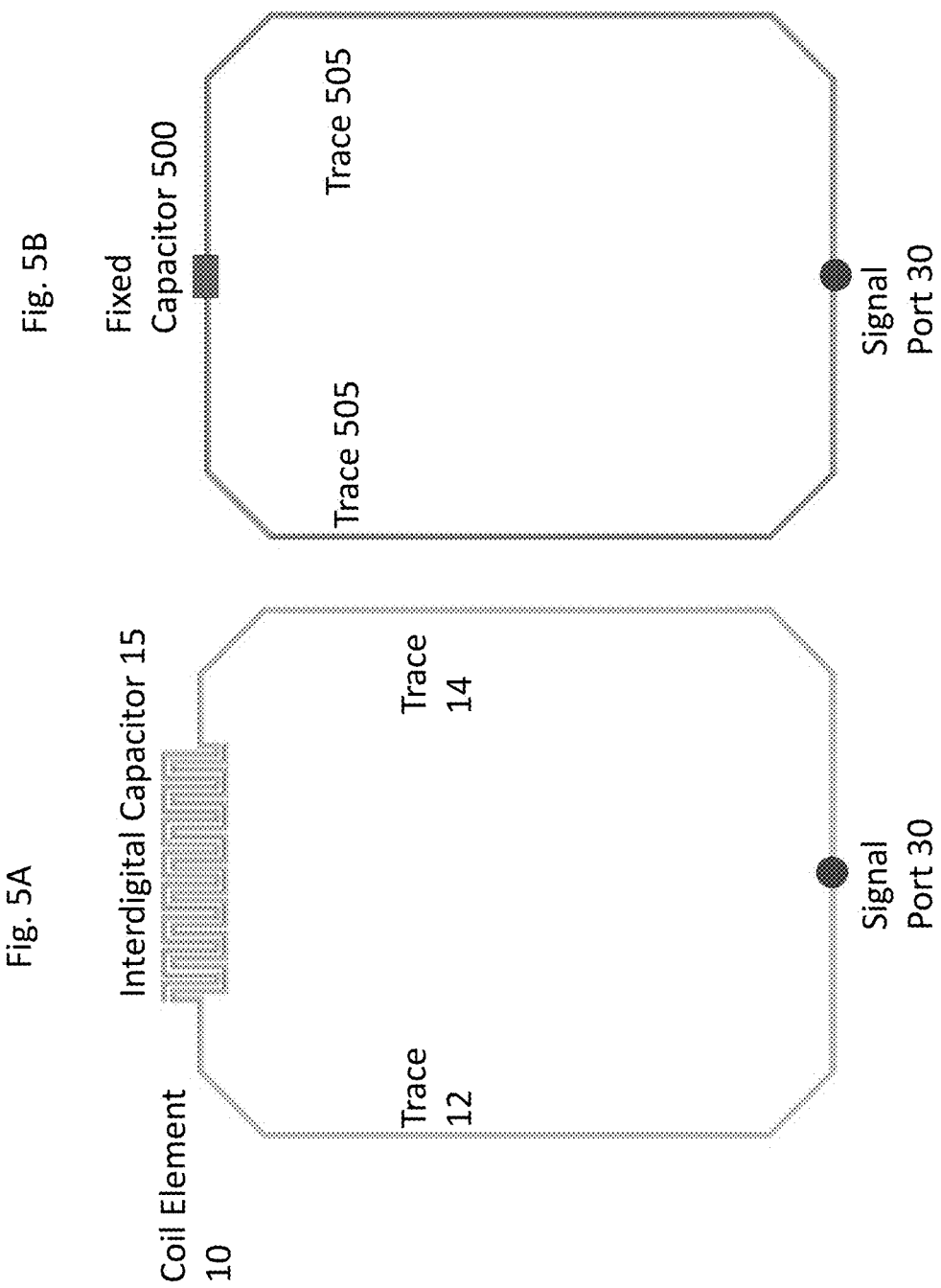

Negative Mold
1015

Gap
1010

Microchannels
1005

Tube For jumper wire and sealant 1050

Single layer, multiple coil element 1000

Polymer Matrix for Multiple Coils with microchannels 1020

Extended area
1105

Microchannels
25

Overlap 810

Coil 1

Coil 2

Dual layer, Multiple
Coil Element 1100

Coil 1

Coil 2

Dual layer, multiple coil element 1100'

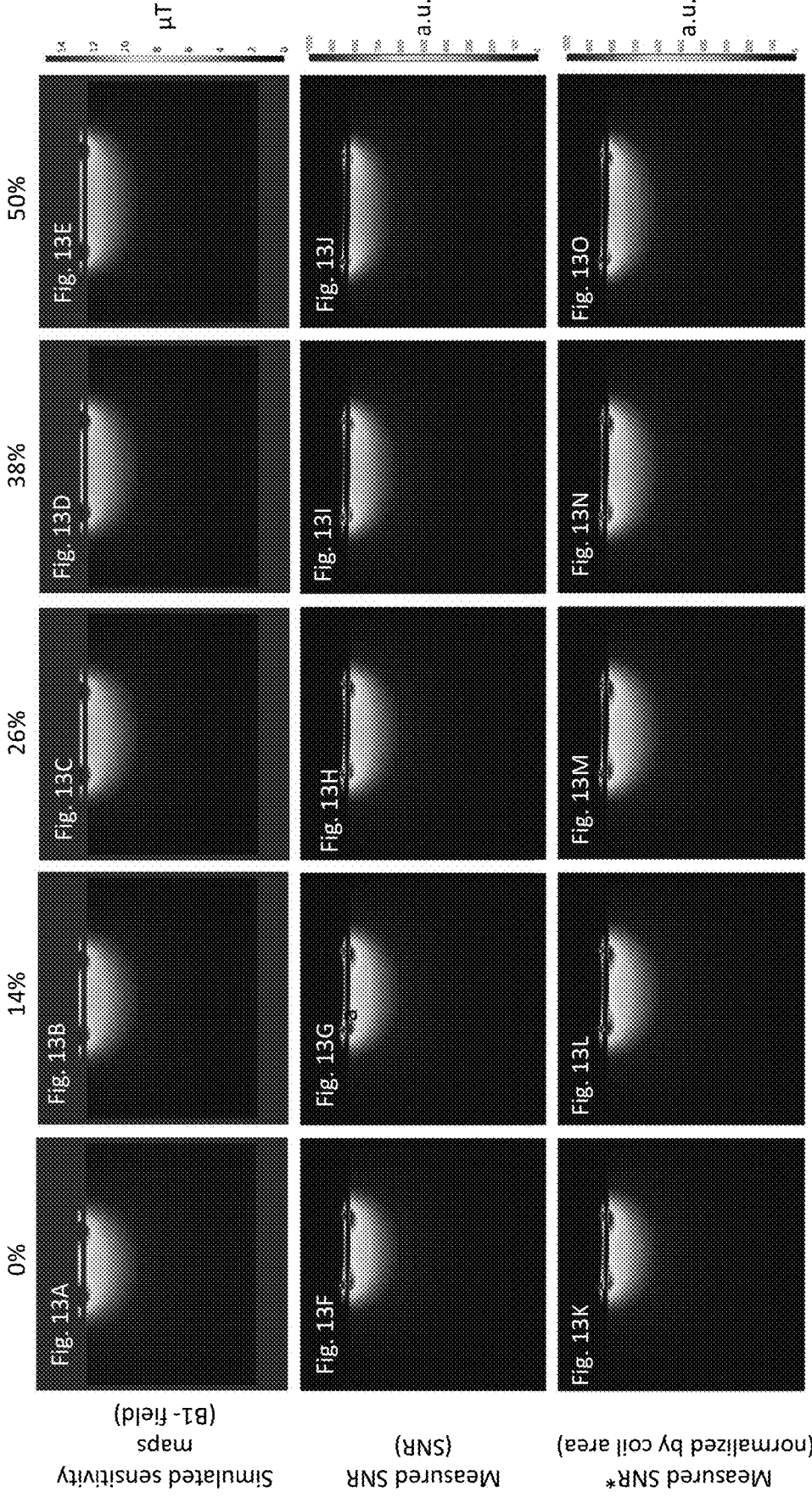

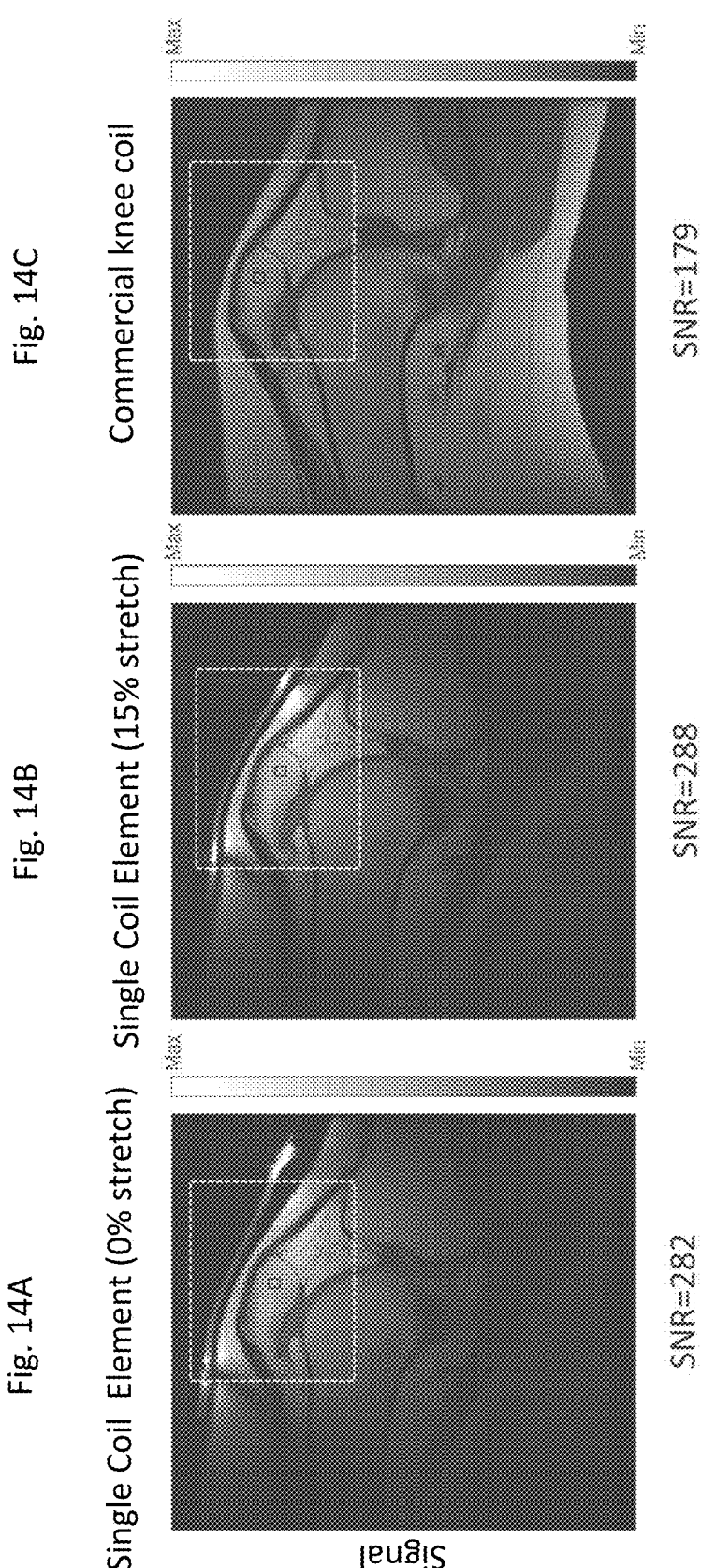

Single Coil Element (0% stretch)

Single Coil Element (15% stretch)

Commercial knee coil

Cylindrical Phantom 1500

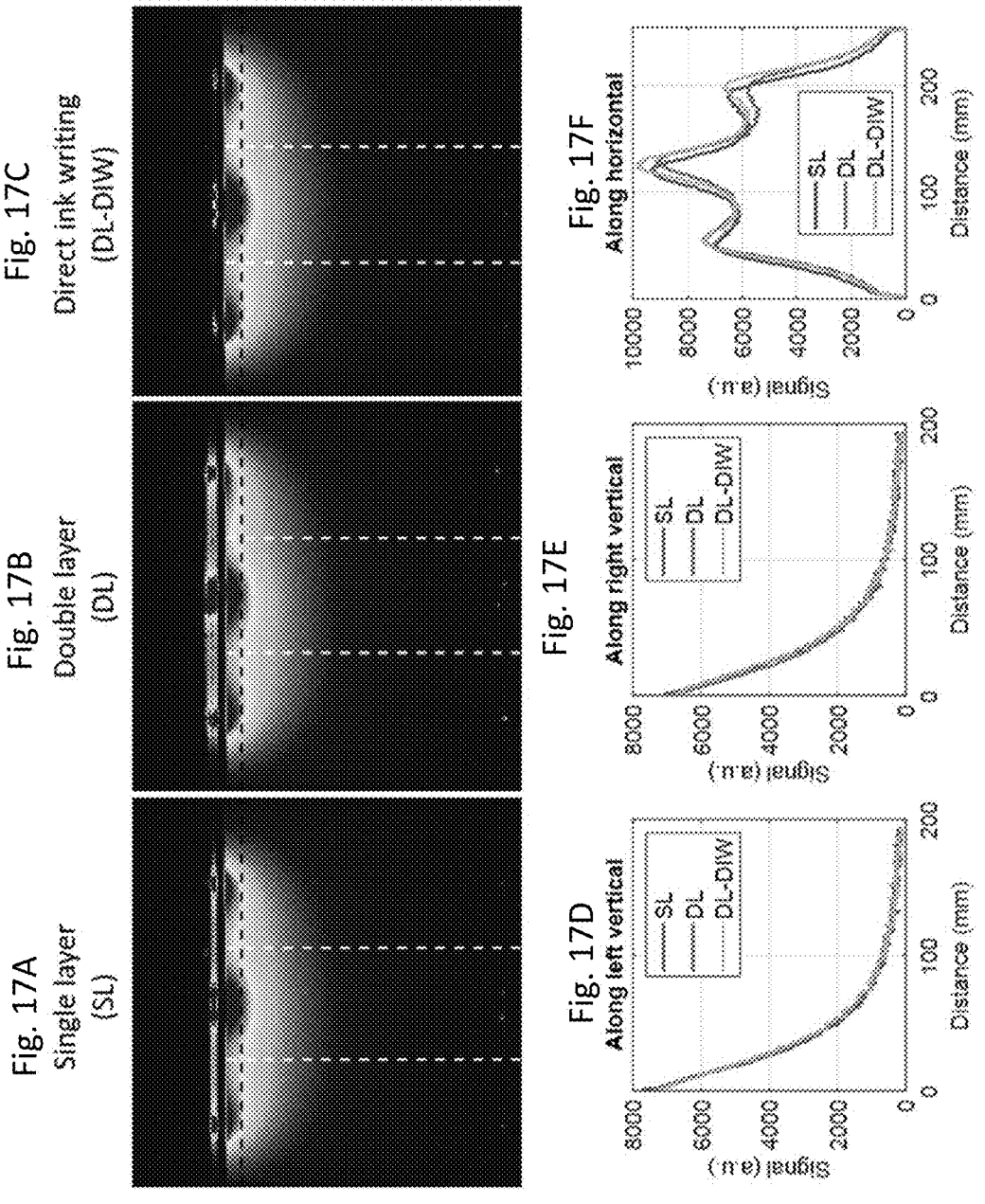

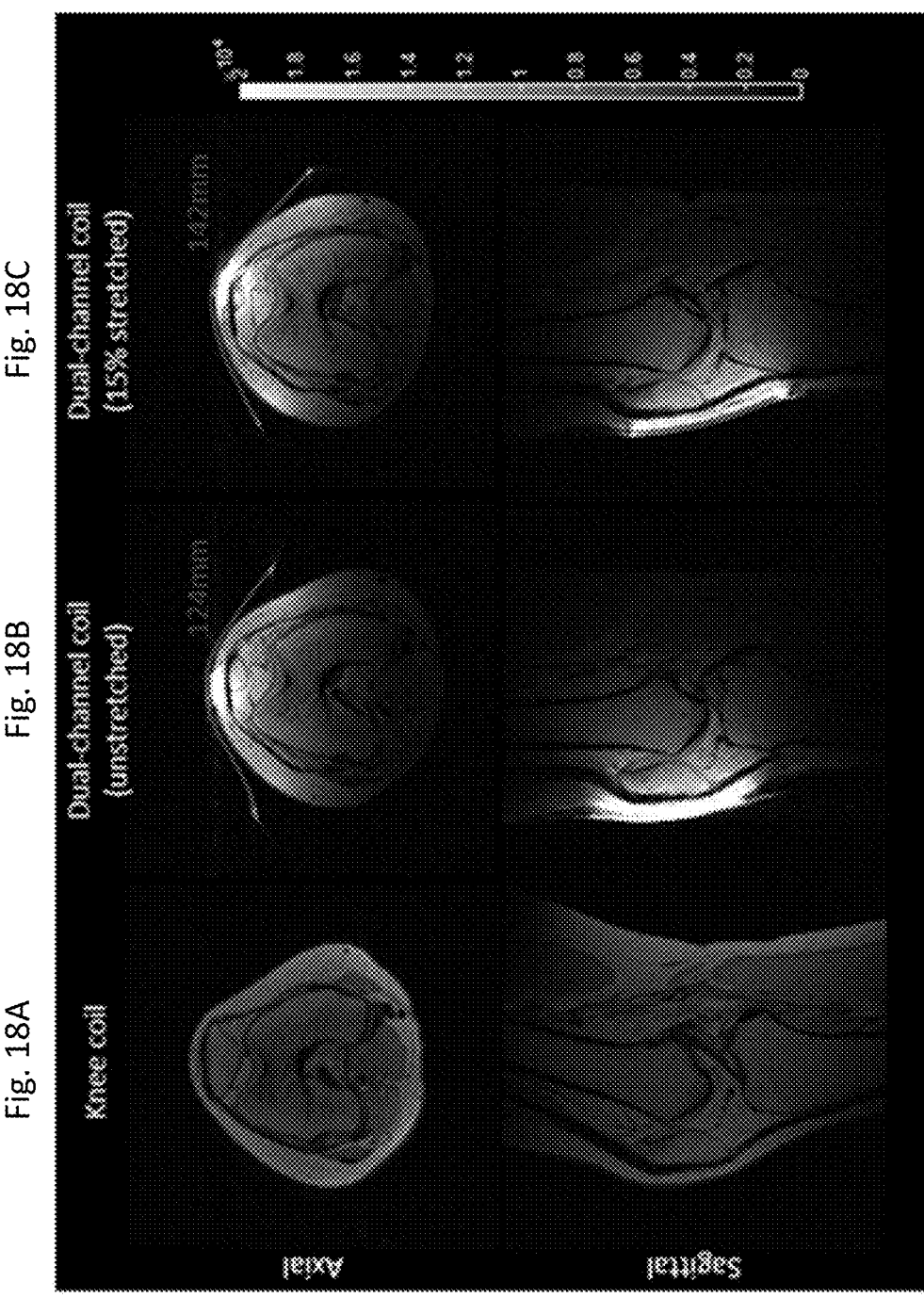

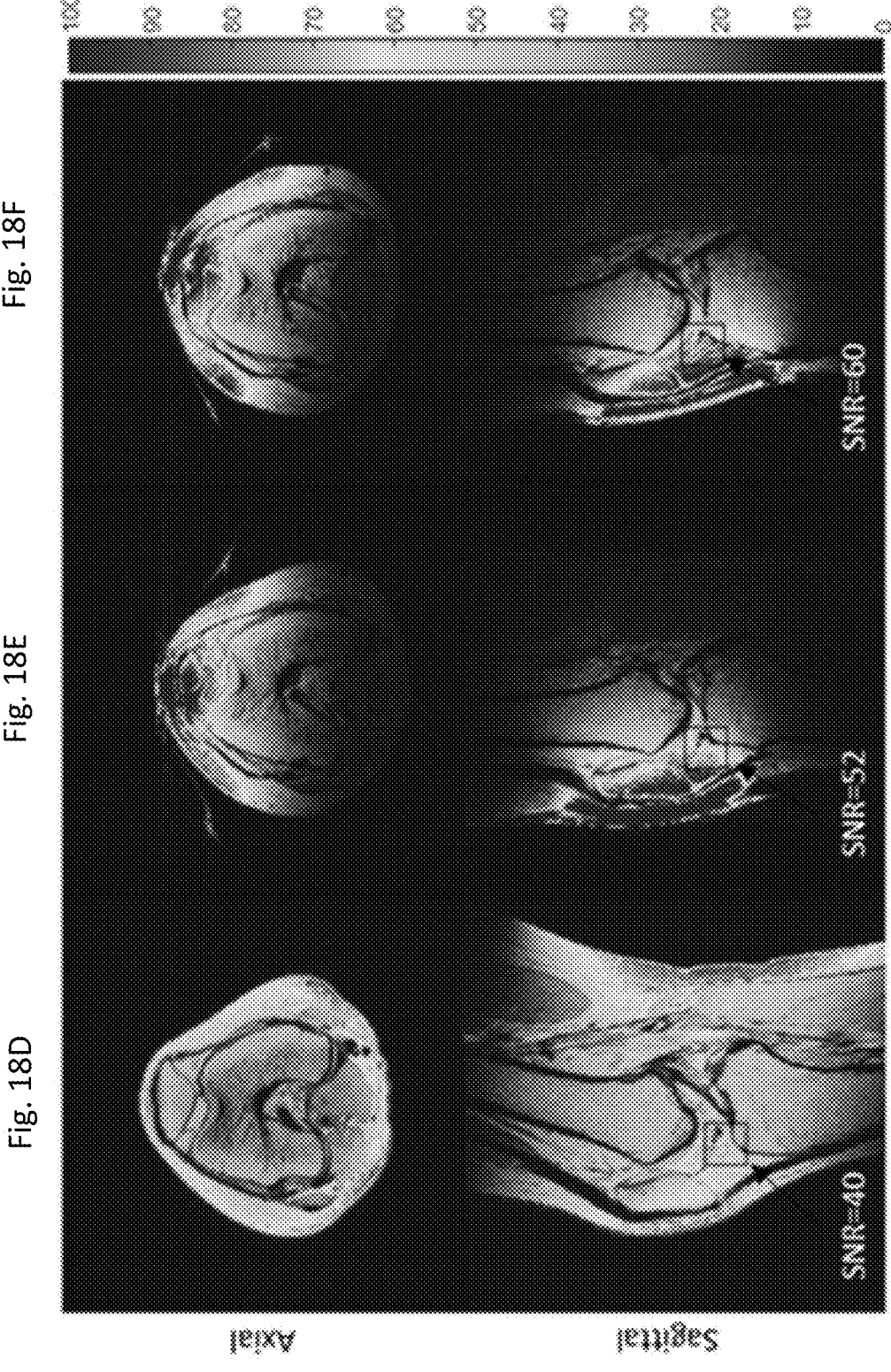

SELF-TUNING LIQUID METAL RF COIL AND COIL ARRAY FOR MRI

CROSS-REFERENCE TO RELATED APPLICATIONS

This application claims the benefit of and priority to U.S. Provisional Application Ser. No. 63/181,664 filed on Apr. 29, 2021, the entirety of which is incorporated by reference.

FIELD OF THE DISCLOSURE

This disclosure relates to self-tuning radio-frequency (RF) coil(s) for magnetic resonance imaging (MRI).

BACKGROUND

Magnetic resonance imaging (MRI) is an indispensable technique to noninvasively depict anatomic structures and facilitate diagnosis. MRI systems rely on signal detection via one or more radiofrequency coils. Although, most commercial receiving coils are rigid and inflexible ideally one or more coils (coil array) needs to provide both bendability and form-fitting stretchability to accommodate various body parts to ensure optimal signal to noise ratio (SNR). However, most commercial MRI coils are generally built to accommodate general patient population (wide range of anatomical dimensions), which increases the mean offset distance of the coil(s) from the anatomy and therefore reduces the available SNR. Typically, these images have limited spatial imaging resolution due to the suboptimal SNR.

The use of a standardized sized coil design is particularly a problem when trying to use the same coil(s) for adults, infants and small children. Even within the adult population, there are a wide range of sizes.

Imaging long bones provides another challenge, as the length and circumference of the extremities vary significantly in the population.

To solve these problems, certain coil arrays have been proposed to be flexible and stretchable to improve ergonomics, versatility and patient comfort while also improving SNR and image resolution. For example, the coils may be made of liquid metal. However, when stretching, the dimensions of the coil(s) change which shift the resonance frequency of the coil(s) and thus SNR performance benefits, which were obtained by arranging the coils closer to the anatomy (due to the flexibly), are lost. In particular, when the dimension of a coil loop element changes, its resonance frequency changes accordingly. A coil's inductance is proportional to the coil conductor length, which means that if a coil is stretched, the coil inductance is increased, and the resonance frequency is decreased. The frequency shifts and the variation in coupling change the source impedance presented at a pre-amplifier, which results in a decrease in the SNR.

Several approaches have been proposed to mitigate the effect of frequency shift of a flexible and stretchable coil(s). For example, wide-band matching and automatic tune/matching circuitry has been proposed. However, both of these mechanisms rely on additional circuitry in the system, which decreases reliability and increases power as well as increases the complexity and space required. Space is particularly a premium and extremely scarce in a narrow MRI bore, especially in arrays with a high channel count and associated tuning circuitry per channel.

One known coil structure uses AIR™ Technology which provides a high degree of flexibly however is not stretchable. Additionally, other known designs for a "flexible" coil(s) are bulky and limited in their flexibility to a single direction.

Using high impedance coaxial coils have been proposed. These coils have demonstrated high flexibility and form-fitting adaptability while also providing good element isolation. However, the individual coil diameter cannot be chosen freely as it is dictated by the desired resonance frequency and properties of the coaxial cable and commercially available coaxial cables have a limited and discrete set of impedances leading to discrete values of achievable coil diameters.

SUMMARY

Accordingly, disclosed is a RF coil for a magnetic resonance imaging (MRI) scanner which may comprise multiple traces. These traces may be flexible. The RF coil may have a first flexible conductive trace and a second flexible conductive trace. One end of the first flexible conductive trace and a corresponding end of the second flexible conductive trace may be shaped to form the interdigital capacitor. The other ends may be connected with the MRI scanner via one or more circuits. These circuits may include tuning and matching circuitry and a preamplifier.

In an aspect of the disclosure, the geometry of the interdigital capacitor and loop portion of the RF coil may be set to offset the resonance frequency shift under a stretching condition without requiring additional circuitry for re-tuning. For example, the number of digits, gap between the one end of the first flexible conductive trace and the corresponding end of the second flexible conductive trace, and digit length may be based on at least one of a patient size, coil size, a body part, expected motion or magnetic field of the scanner.

In an aspect of the disclosure, the flexible traces may be formed from liquid metal. The liquid metal may be encapsulated in a soft and stretchable polymer matrix which provides material elasticity, flexibility, and conformity to the targeted anatomy. The liquid metal may be formed in microchannels. In an aspect of the disclosure, the liquid metal may be gallium alloys. Since the coils are wearable and conformal, the coils are in a closely-fitting position which leads to improved high-resolution imaging. In an aspect of the disclosure, the RF coil may be conformal to body parts selected from a group consisting of breast wall, chest wall, groin, neck, knee and shoulder. The RF coil may stretch with the motion of a joint or body part.

In an aspect of the disclosure, the RF coil may be stretchable by at least 30% in a first direction orthogonal to digits of the interdigital capacitor. Under a stretching of 30%, the change in resonance frequency may be less than 2% from the resonance frequency of the coil not stretched.

In an aspect of the disclosure, the RF coil may have any shape (loop plus interdigital capacitor). For example, the loop may have a rectangular shape. In some aspects, the loop may have geometry other than a rectangle, such as e.g., a circle or an octagon.

In an aspect of the disclosure, the flexible polymer matrix may comprise an elastomer. In an aspect of the disclosure, the elastomer may be doped with a contrast agent. For example, the contrast agent may be gadolinium-based. The elastomer may be Ecoflex®. In an aspect of the disclosure, a ratio between the Ecoflex® and the contrast agent is such that the RF coil substantially invisible on an MR image.

Also disclosed is a RF coil having multiple interdigital capacitors. At least two of the interdigital capacitors may be orthogonal to each other. In this aspect, the coil may comprise a plurality of flexible conductive traces. For example, the coil may have three or more flexible conductive traces. One end of the first flexible conductive trace and a corresponding end of the second flexible conductive trace may be shaped to form a first interdigital capacitor. The other end of the second flexible conductive trace and a corresponding end of the third flexible conductive trace may be shaped to form a second interdigital capacitor. The first interdigital capacitor may be orthogonal to the second interdigital capacitor. The other end of the third flexible conductive trace may be connectable with the MRI scanner through one or more circuits including tuning/matching circuitry and a preamplifier.

The RF coil(s) may be stretchable by at least 30% in a first direction orthogonal to digits of the first interdigital capacitor and in a second direction orthogonal to digits of the second interdigital capacitor.

In an aspect of the disclosure, the RF coil may further comprise a fourth flexible conductive trace. One end of the fourth flexible conductive trace and the other end of the third flexible conductive trace may be shaped to form a third interdigital capacitor. The other end of the fourth flexible conductive trace may be connect with the MRI scanner through one or more circuits including tuning/matching circuitry and a preamplifier.

Also disclosed is a coil array which may comprise a plurality of coils. Each coil may comprise multiple flexible traces. Each coil may have a first flexible conductive trace and a second flexible conductive trace. One end of the first flexible conductive trace and a corresponding end of the second flexible conductive trace may be shaped to form the interdigital capacitor. The other ends may be connected with the MRI scanner via one or more circuits. These circuits may include tuning and matching circuitry and a preamplifier.

In an aspect of the disclosure, the flexible traces may be formed from liquid metal. The liquid metal may be encapsulated in a soft and stretchable polymer matrix which provides material elasticity, flexibility, and conformity to the targeted anatomy. The liquid metal may be formed in microchannels.

In an aspect of the disclosure, each coil may be located in the same layer of the flexible polymer matrix. In other aspects, the coils may be arranged in a dual layer and adjacent coils may be located in different layers of the dual layer. Adjacent coils may overlap. In an aspect of the disclosure, the amount of overlap may be set such that cross-talk between the adjacent coils is less than a preset threshold.

In an aspect of the disclosure, an interdigital capacitor in each coil may be aligned with a corresponding interdigital capacitor in other coils.

In an aspect of the disclosure, the coil array may be wearable and conformal. Since the coil array is wearable and conformal, the coil array is in a closely-fitting position which leads to improved high-resolution imaging. In an aspect of the disclosure, the coil array may be conformal to body parts selected from a group consisting of breast wall, chest wall, groin, neck, knee and shoulder. The coil array may stretch with the motion of a joint or body part.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 5A illustrates a coil element in accordance with aspects of the disclosure and FIG. 5B illustrates an example of a coil element with flexible traces;

FIG. 8C illustrates an input impedance for one of the coils and FIG. 8D illustrates the cross-talk;

FIGS. 13A-13E illustrate simulation results for a B-field for a single coil element in accordance with aspects of the disclosure, on a simulated phantom;

FIGS. 13F-13J illustrate the SNR maps obtained under different stretching conditions using a single coil element in accordance with aspects of the disclosure, on an actual phantom;

FIGS. 13K-13O illustrate normalized SNR maps corresponding to FIGS. 13F-13J, respectively;

FIGS. 14A-14C illustrate the fast spin echo images, where FIG. 14A is acquired using an unstretched single coil element described herein, FIG. 14B is acquired using a 15% stretched single coil element described herein and FIG. 14C was acquired using the 8-channel commercial knee coil;

FIG. 15A illustrates a dual layer multiple coil element on the curved phantom.

FIGS. 17A-17F illustrate a comparison of measurement results of coil elements fabricated using different techniques in accordance with aspects of the disclosure where in FIG. 17A/FIG. 17D, a single layer, two coil element was used (molded) (SL); in FIGS. 17B/17E, a dual layer, two coil element was used (molded) (DL) and in FIGS. 17C/17F, a dual layer, two coil element was used (DL-DIW);

FIGS. 18A-18F illustrate a comparison of measurement results from a dual layer, two coil element fabricated using direct ink writing in accordance with aspects of the disclosure and a dedicated commercial knee coil, where FIGS. 18A/18D are image/SNR map acquired using the dedicated commercial knee coil, FIGS. 18B/18E are image/SNR map acquired using the dual layer, two coil element under no stretching and FIGS. 18C/18E are image/SNR map acquired using the dual layer, two coil element under 15% stretching;

FIGS. 20A-20C are SE images, FIGS. 20D-20F are SNR maps and FIGS. 20G-20I are signals inside a phantom.

DETAILED DESCRIPTION

Figure 1A:
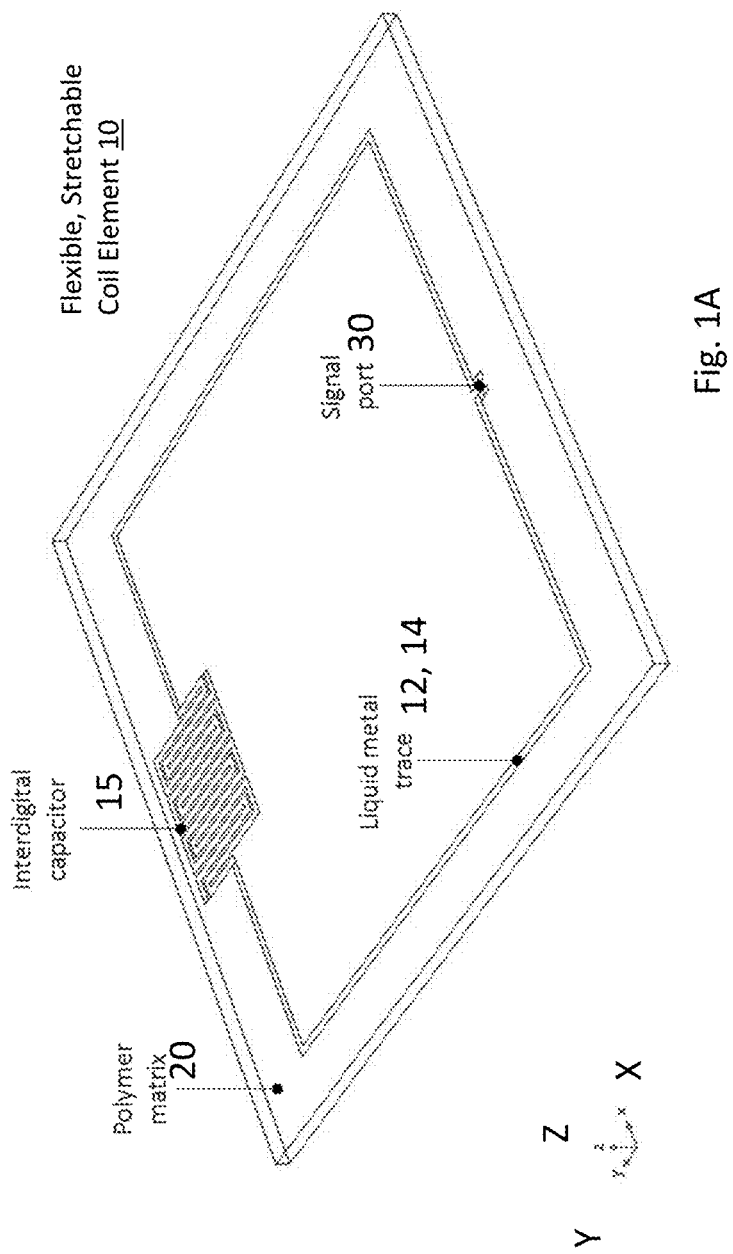
FIG. 1A illustrates an example of a flexible, stretchable coil element in accordance with aspects of the disclosure.
Figure 1B:
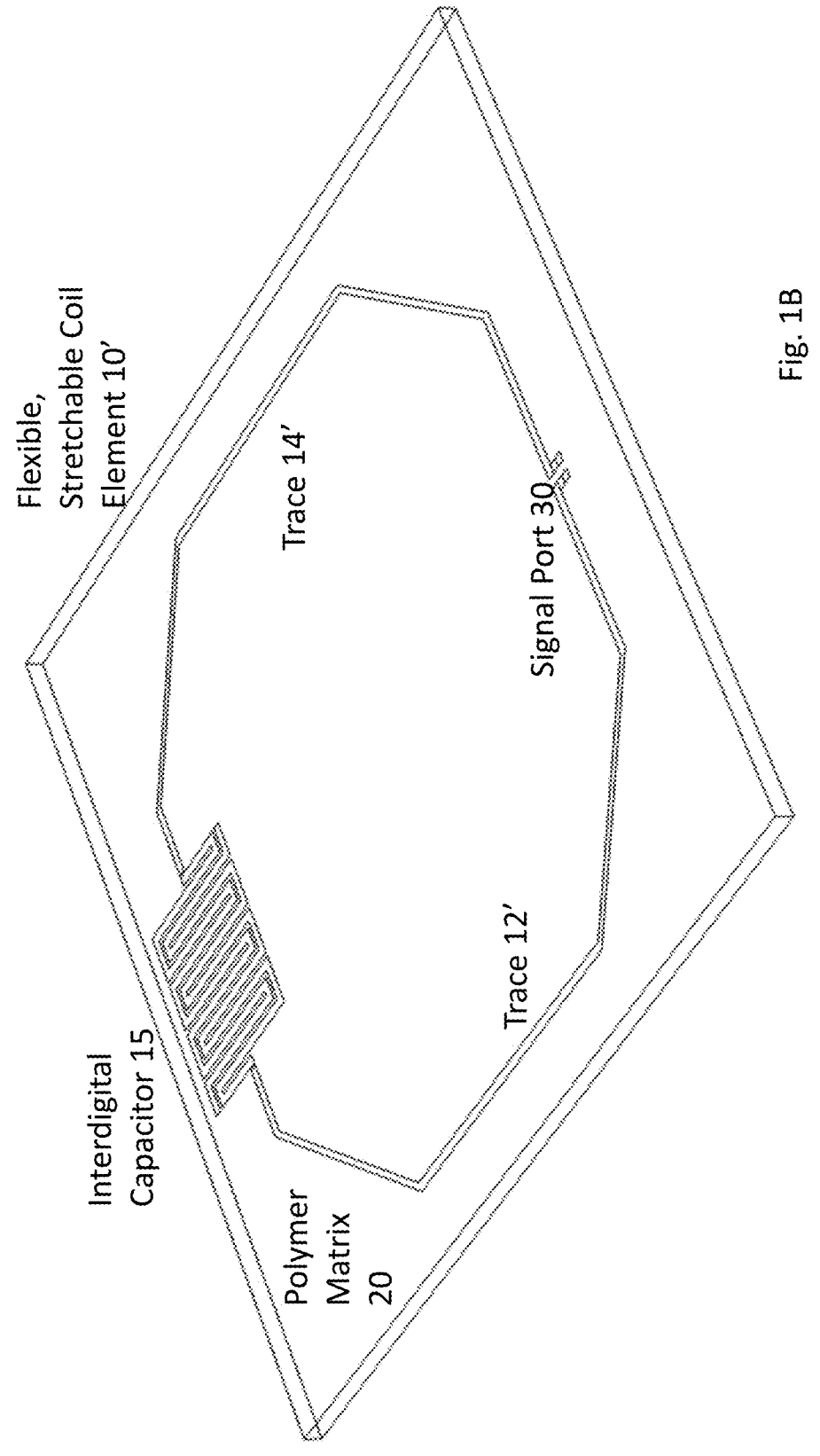
FIG. 1B illustrates another example of a flexible, stretchable coil element in accordance with aspects of the disclosure where the loop of the coil is a different shape.

FIG. 1A illustrates an example of a flexible, stretchable coil element 10 in accordance with aspects of the disclosure for use in MRI. The coil element 10 may be wearable, stretchable, and conformal to a target body part. This increases signal sensitivity due to the minimized distance between the coil(s) and the anatomy. The coil element 10 may comprise one or more coils. As illustrated in FIG. 1A, the coil element 10 comprise a single coil. In an aspect of the disclosure, the coil element 10 comprises liquid metal traces 12, 14 and a polymer matrix 20. The polymer matrix 20 comprises microchannels for the liquid metal traces 12, 14. A pair of traces, e.g., 12, 14, form an interdigital capacitor 15. As illustrated in FIG. 1A, the traces 12, 14 form a rectangular loop. However, the shape of the loop is not limited to the example illustrated in FIG. 1A. For example, FIG. 1B illustrates a coil element 10' in accordance with other aspects of the disclose having a different shaped loop. In some aspects, the traces 12' and 14' may form a shape such as circular or octagon. The shape is not limited to the disclosed examples.

In an aspect of the disclosure, the polymer matrix 20 may be formed of a soft silicone elastomer. The soft silicone elastomer enables the flexibility of the coil element 10. For example, the polymer matrix 20 may be made of a material such a Ecoflex®. However, the material for the polymer matrix 20 is not limited to Ecoflex® and other materials may be used. For example, another liquid silicone such as Drag-onSkin™ 30 (by Smooth-On) may be used. In other aspects, the polymer may be made of other elastomer material(s) that are not silicone based. The type of material used for the polymer matrix 20 may be selected based on the target stretching needed. For example, coil elements 10 used for adults may be fabricated with a different polymer material than coil elements 10 for infants. Additionally, coil elements 10 used for different body parts may be fabricated with different polymer materials. Different MRI systems have different field strengths and resonance frequencies and coil elements 100 used for different MRI system may also have different material(s).

Ecoflex® is an extremely flexible and stretchable polymer and matches the elastic compliance of human skin. With a Poisson ratio of 0.5, Ecoflex® ensures isovolumetric behavior under strain, which results in favorable pressure conditions for containing liquid metal inside microchannels. As will be described later, the Ecoflex® may be doped with one or more other materials to reduce visibility of the coil(s) in the MR images. For example, manganese (Mn or gadolinium (Gd) may be added to the Ecoflex® to increase relaxivity and hence reduce signal in MR images.

Ecoflex® has a permittivity of $\varepsilon_r=2.8$, which is relatively low. In some aspects of the disclosure, the permittivity may be increased by mixing the uncured polymer with a high permittivity material. For example, in some aspects, barium titanate BaTiO3(BTO) nanoparticles may be mixed with the polymer. Since as shown below, the capacitance of the interdigital capacitor is impacted by the permittivity of the host, other properties of the coil element 10 such as capacitance may be changed based on the permittivity.

In an aspect of the disclosure, polymer matrix 20 and the layout of the microchannels may be formed by a mold. For example, a 3D printer may be used to create plastic mold that contains a layout of a predetermined pattern for the conductive traces 12, 14 (which forms the interdigital capacitor 15). The plastic mold may be a negative mold. The plastic mold may be made of a polylactic acid (PLA). The mold may have a preset height to provide a target thickness for one portion of the polymer matrix. For example, the height may be 50 μm.

Another mold of the same size (length and width) may also be prepared by 3D printer for a scaling portion. In an aspect of the disclosure, a high precision 3D printer may be used with a minimum resolution of 0.2 mm.

Uncured Ecoflex® elastomer, prepared by mixing equal parts of its two components and degassing the mixture in a vacuum chamber to remove any air bubbles, may be then cast and cured in the negative mold until fully solidified. The cured elastomer may be released from the negative mold and a flat sealing portion is attached that covers the patterned elastomer. In an aspect of the disclosure, the flat sealing portion may be between 0.5 mm and 1.5 mm thick. For example, the flat sealing portion may be 1.0 mm. The two portions may be bonded together to form a stretchable polymer matrix 20 containing patterned microchannels.

The thickness of the elastomer should be sufficiently thin as to not create noise or impede the flexibility or stretchability, but at the same time reduce a risk of a small tear in the matrix which leads to liquid metal spilling out of the polymer.

In other aspects of the disclosure, the polymer matrix 20 and the layout of the microchannels may be formed via direct ink writing (DIW). DIW is a 3D printing technique that uses liquid inks, which are dispensed under a controlled flow rate on a controllable path, to create target objects. The materials used for DIW may be the same as described above such as the flexible silicone resin. The DIW process may be faster than the above molding processing. Direct 3D printing of the flexible silicone resin on various substrates is largely automated and assembly-free, allowing to circumvent laborious manual fabrication required in a molding process. The DIW offers rapid turn-around time. Additionally, the DIW process may produce a thinner polymer matrix 20. The thinner polymer matrix 20 may result in the coil element 10 not being seen in the MR images. The liquid silicone may be spin coated on a glass panel. The microchannels are directly printed on the coated glass panel, e.g., the walls of the microchannels. For example, a 3D printer from Musashi, Japan, model SHOTmini200'ΩX may be used. A fast-curing silicone sealant may be used as liquid ink for the walls the microchannels. A silicone sheet may be used to seal the channels. In an aspect of the disclosure, the silicone sheet may be molded or 3D printed. The two portions may be bonded together to form a stretchable polymer matrix 20 containing patterned microchannels.

In an aspect of the disclosure, the liquid metal traces 12, 14 may be formed from a gallium alloy. For example, euGaIn or Galinstan® may be used. euGaIn remains in its liquid form at temperatures above 15.7° C./60.3° F., has low vapor pressure and low toxicity. In an aspect of the disclosure, microparticles may be added to the gallium alloy. For example, gold microparticles may be added which can slightly increase the conductivity of the liquid metal. This improvement in conductivity may reduce coil losses, improve a Q factor and increase the SNR of the coil element 10.

In an aspect of the disclosure, the liquid metal may be injected into the microchannels using a needle and a syringe to form the traces 12, 14.

In other aspects of the disclosure instead of liquid metal being used as the material for the traces 12, 14, a conductive elastomer may be used with nanoparticles. The nanoparticles may include silver nanoparticles. While the conductivity of the silver nanoparticles may be less than the liquid material, the conductive elastomer with the silver nanoparticles may provide comparative Q-factor and SNR values.

Signal ports 30 may be formed by inserting copper wires at the terminus of the microchannels to create the contacts for other electrical components of the circuit. These components may include one or more printed circuit boards having tuning, matching, detuning electronics and an integrated preamplifier module.

The interdigital capacitor 15 provides for a self-tuning, which minimizes a shift in a resonance frequency under a stretching condition. This allows for the coil element 10 to be used to acquire images of anatomies of various sizes and under various flexion angles. For example, the flexibility, stretchability and self-tuning allows for image of various complex human anatomies, such as cervical spine, perineum/groin, breast/chest, neck/shoulder, or knee. However, the body parts listed herein are for descriptive purposes, only by way of example, and the coil element 10 may be placed on other body parts as needed for imaging.

Figure 2:
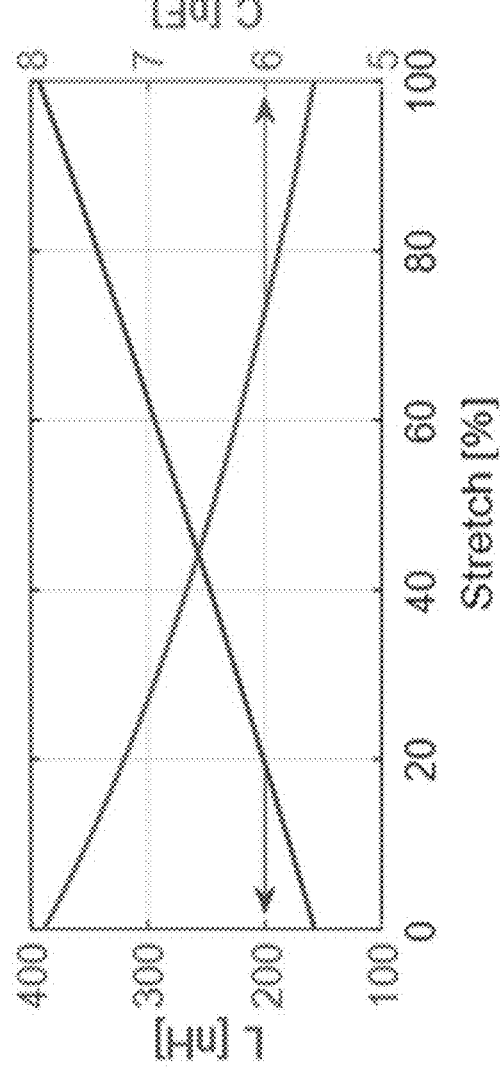
FIG. 2 illustrates an example of the inductance and capacitance change for a coil element under a stretching condition perpendicular to digits of an interdigital capacitor in accordance with aspects of the disclosure.

When the coil element 10 is stretched, for example, in the x direction, the inductance increases. However, in accordance with aspects of the disclosure, the capacitance of the interdigital capacitor 15 decreases, which offsets the increase. An example of the change in inductance L and capacitance C for the coil element 10, under a stretching in the x direction is shown in FIG. 2. Therefore, a change in the resonance frequency may be minimized without additional circuitry for tuning. As shown in FIG. 2, the increase in inductance is approximately linear with the stretch. However, the decrease in capacitance is nonlinear, and thus, the change in capacitance cannot perfectly compensate for the linear change in inductance and there may be a small change in resonance.

An interdigital capacitor stretched by a factor α, applied perpendicular to the fingers (digits) of the capacitor 15 (x direction in FIG. 1A), exhibits a total capacitance of $C=C_0/\alpha$ where $C_0$ is the initial capacitance of the interdigital capacitor 15 and can be calculated as $$C_0 = \frac{(N-3)C_I}{2} + 2C_I C_E/(C_I + C_E).$$

N is the number of digits in the interdigital capacitor 15. $C_I=\varepsilon_0\varepsilon_r bK(k_{I\infty})/K(k'_{I\infty})$, $C_E=\varepsilon_0\varepsilon_r bK(k_{E\infty})/K(k'_{E\infty})$, where $\varepsilon_0$ is the vacuum permittivity, $\varepsilon_r$ is the host material permittivity, b is the digit length, K(k) is the complete elliptical integral of the first kind with modulus k, $k'=\sqrt{1-k2}$ is the complementary modulus, and $k_{I\infty}=\sin(\pi\eta/2)$, $k_{E\infty}=2\sqrt{\eta}\sqrt{1+\eta}$, $\eta=w/w+g$.

Since the resonance $f_0=1/(2\pi\sqrt{L\cdot C})$, where $f_0$ is the resonance frequency, and L and C are the total inductance and capacitance of the coil, respectively substituting the total capacitance and inductance into the resonance formula, the coil element 10 may have its resonance frequency change approximately inversely proportional to the stretching factor to the power of ¼: $f\sim f_0\cdot\alpha^{-1/4}$. On the other hand, a traditional coil with a fixed capacitance value ($C=C_0$) exhibits a frequency dependence on the degree of stretch that is inversely proportional to the stretching factor to the power of ½: $f\sim f_0\cdot\alpha^{-1/2}$.

Properties of the coil element 10 including of the traces 12, 14 and the interdigital capacitor 15 may be set to minimize the resonance frequency shift within a target range over a target stretching range. For example, the target stretching range may be 30%. The target stretching range is not limited to 30% and other ranges may be used. A target stretching range of 30% allows for the same coil element 10 be to use to image many different body parts. The properties may include (a) coil circumference, (b) number of capacitor digits (fingers), (c) digit length, (d) digit width, and (c) inter-digit spacing (gap).

Figure 3:
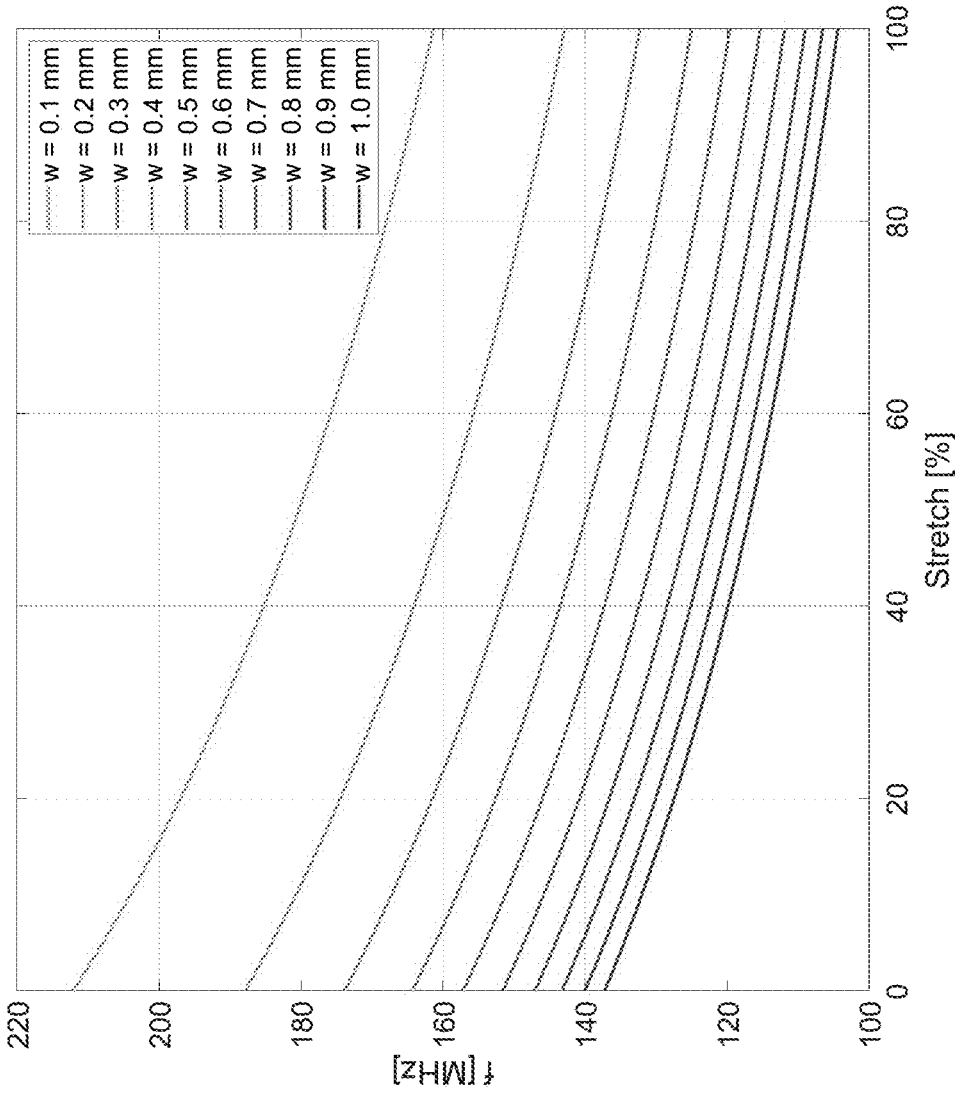
FIG. 3 illustrates a theoretical relationship of trace width and a change in resonance frequency under stretching.

FIG. 3 illustrates the change in resonance frequency for 10 different trace widths ranging from 0.1 mm to 1.0 mm under a stretching condition in the x direction (in FIG. 1A) based on theoretical analysis. As can be seen in FIG. 3, the largest change in resonance frequency is for the smallest trace width. The following properties were maintained for all 10 simulated trace widths. D=10 cm, w=1 mm, g=0.5 mm, b=12 mm. D is the diameter of the loop, d is the diameter of the traces 12, 14, g is the interdigital spacing, and b is the digit length.

Figure 4:
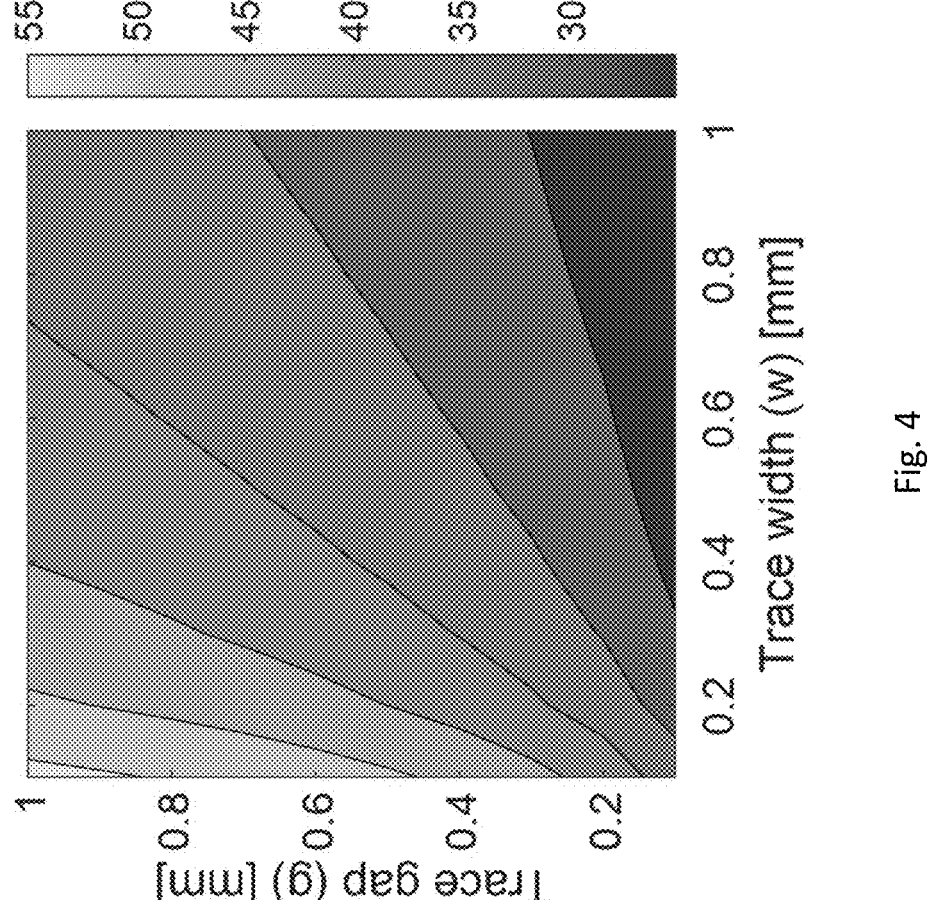
FIG. 4 illustrates a theoretical change in resonance frequency while varying the trace width w and gap (g) between traces at the interdigital capacitor.

FIG. 4 illustrates the change in resonance frequency while varying the trace width w and gap (g) between traces at the interdigital capacitor 15. The frequency change is smaller for wider trace width w values and when the trace gap g (interdigital spacing) is smaller than the trace width w.

The actual coil behavior may be different from the theoretical behavior due to more complex interaction between all the parts and components, which is not fully accounted for in the simplified theoretical model. In some aspects of the disclosure, the theoretical behavior may be used as a starting point for the properties which may be determined using a full wave electromagnetic simulation. At no stretching, the resonance frequency of the coil element 10 may be set to match the operating frequency of the scanner. For example, the operating frequency of a 3T scanner is 128 MHz. The resistance may also be matched. For example, the resistance may be 50 ohms. The above properties may be selected such that the shift due to stretching is minimized over the target strength range, e.g., 0% and 30%. For example, for a substantially rectangular loop that is approximately 6 cm×7 cm, the properties may include: the interdigital capacitor which may have 8 digits, each digit may have a digital length of 7 mm, and the inter-digit spacing may be 0.5 mm. Additionally, the trace width may be 0.5 mm. In some aspects of the disclosure, the trace width may be a function of the resolution of the 3D printer. For determining the properties, the polymer material is included in the model, e.g., Ecoflex® elastomer and a homogenous cylindrical phantom may also be included in the model. The target stretching range may be different for different applications such as elements for different body parts or body types. Different properties may be used for different target stretching ranges.

The simulation results of a coil element 10 in accordance with aspects of the disclosure was compared with a coil array having the same dimensions with a fixed value capacitor. FIGS. 5A and 5B show a side-by-side comparison of a coil element 10 in accordance with aspects of the disclosure (FIG. 5A) having the interdigital capacitor 15 and a coil element with a fixed capacitor 500 and flexible traces 505. Traces 12, 14 may be made of liquid metal as described herein.

Figure 5C:
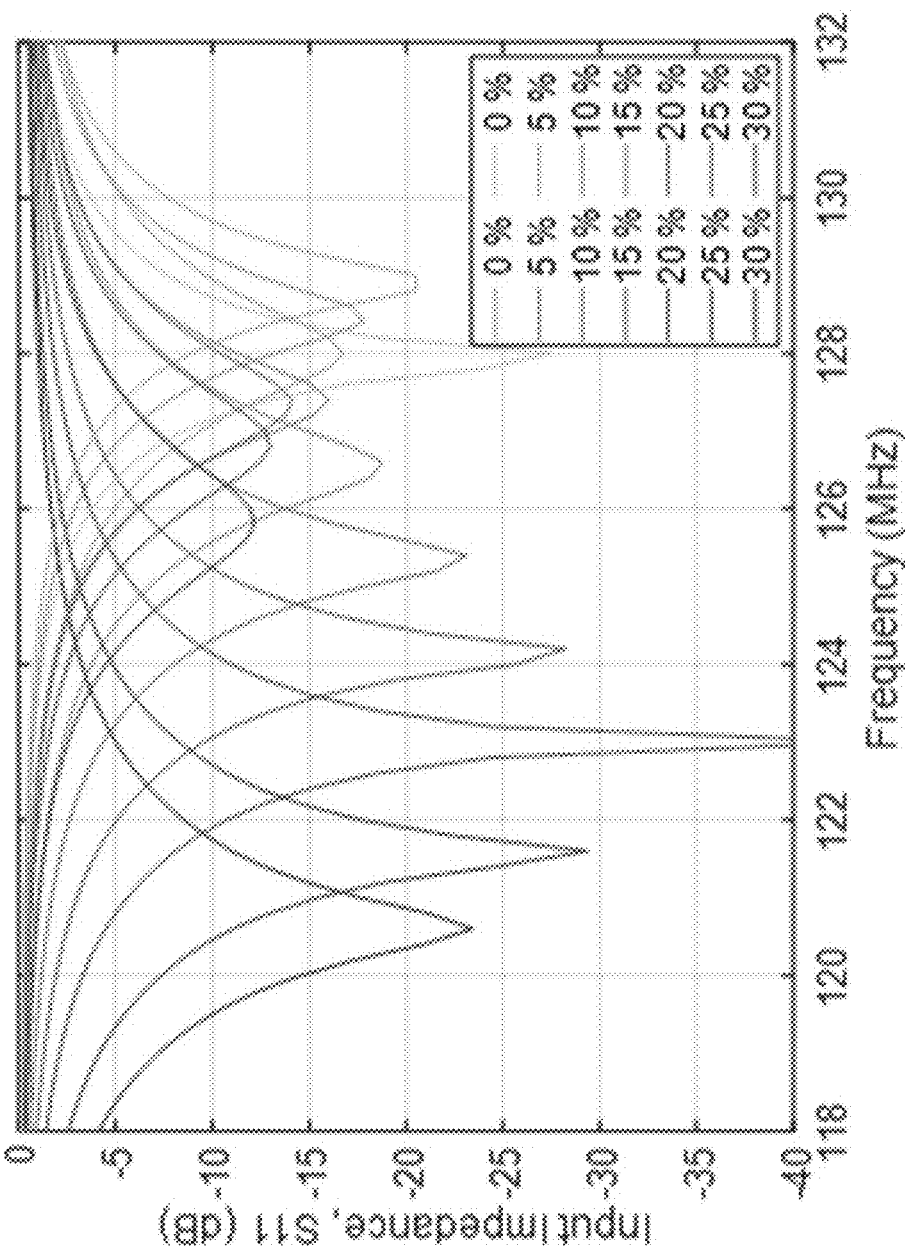
FIG. 5C illustrates a comparison of a simulation results under different stretching conditions for the coil elements illustrated in FIG. 5A and FIG. 5B.

FIG. 5C illustrates the simulation results from the two coil elements illustrated in FIGS. 5A/5B. Specifically, FIG. 5C shows input impedance S11 (on the y-axis) and frequency (on the x-axis). The figure shows six different stretching conditions (and no stretching) where there is a 5% difference between the different stretching conditions. As can be seen in FIG. 5C, the reference coil element (FIG. 5B) has its input impedance S11 linearly shifted toward lower frequencies as expected. However, the input impedance of the coil element 10 in accordance with aspects of the disclosure, fluctuated near the frequency (unstretched), e.g., initial resonance frequency by first shifting to higher frequencies (for up to 15% stretch) and then returns to lower frequencies (for ≥20%, less than the target range). As can be seen in FIG. 5C, the coil element in FIG. 5B exhibited a shift of greater than 7 MHz (7.4 MHZ), which is approximately a 5.8% shift. However, the coil element 10 in accordance with aspects of the disclosure (FIG. 5A) only exhibits a maximum shift of about 2.2 MHz, which is approximately a 1.7% shift. Thus, in accordance with aspects of the disclosure, there may be an approximately 70% improvement in the frequency shift.

Figure 5D:
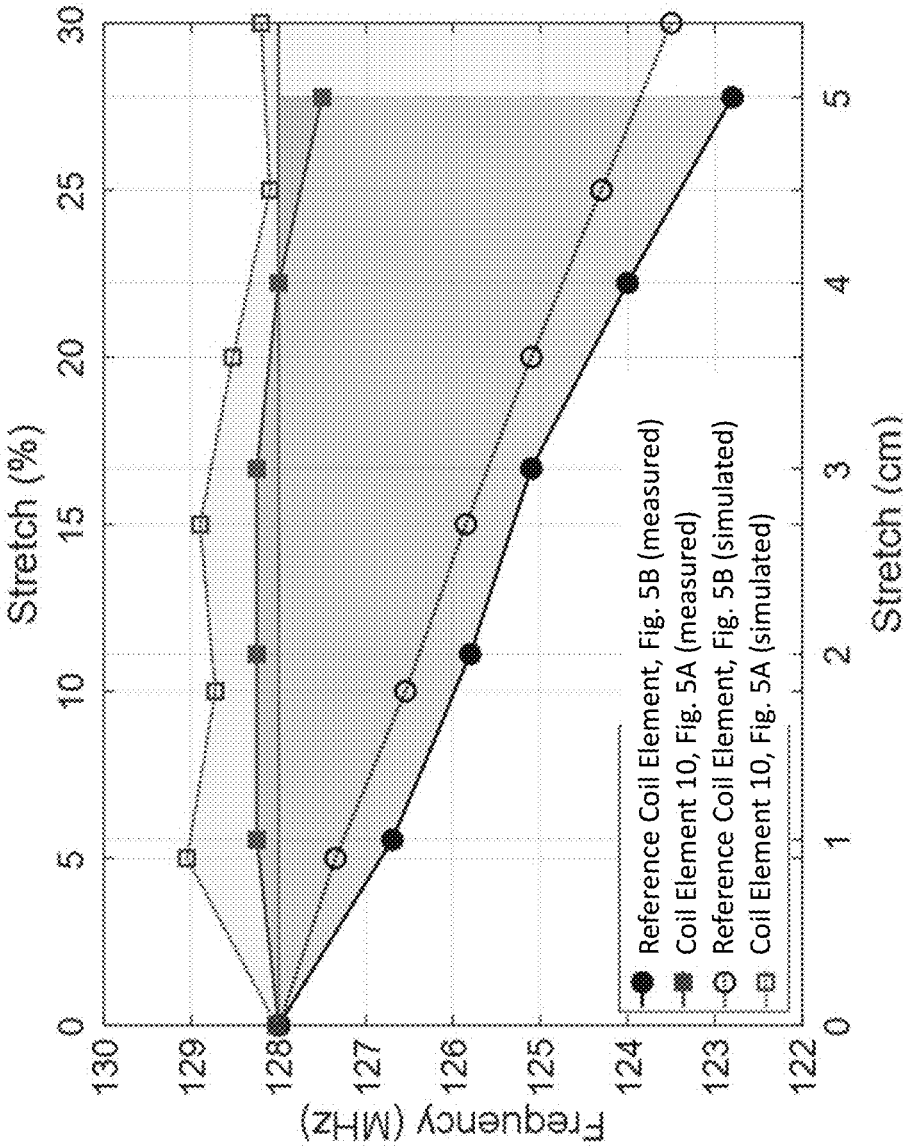
FIG. 5D illustrates a comparison of simulation and measurement results under different stretching conditions for the coil elements illustrated in FIG. 5A and FIG. 5B.

The two coil designs (FIGS. 5A and 5B) were fabricated and tested having the same properties used in the simulation. The coil elements were connected to a 3D-printed unidirectional stretch testing rig. The coil elements (FIGS. 5A/5B) were also connected to a vector network analyzer through an L-shaped tune/match network. FIG. 5D illustrates a comparison of the measurement results for both coil elements as well as the simulation results. Shading is added to highlight the total frequency shift. The simulated curves are identified by opened shapes (circles/squares) and the measured curves are identified by closed shapes (circles/squares). The squares are for the coil element 10 in accordance with aspects of the disclosure as shown in FIG. 5A. The circles are for the coil element as shown in FIG. 5B. As shown in FIG. 5D, the measured data agrees well with the simulation results. Additionally, as shown in FIG. 5D, the frequency shift is significantly improved using the coil element 10 in accordance with aspects of the disclosure verses the coil element in FIG. 5B. At a measured maximum stretch of 5 cm which corresponds to approximately 27% stretching), the frequency shift for the coil element 10 in accordance with aspects of the disclosure is only 0.5 MHZ (0.4%) as compared with greater than 5 Mhz (greater than 4%). This is a ten-fold reduction in the frequency shift.

Figure 5E:
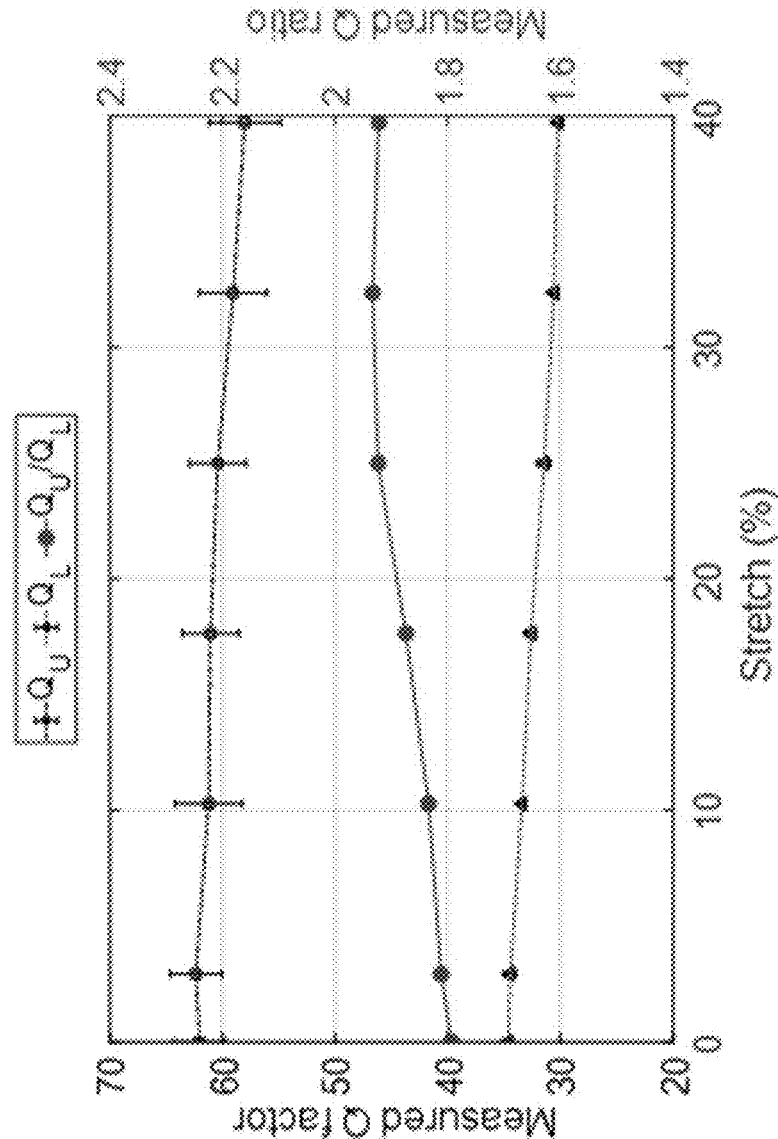
FIG. 5E illustrates a measured loaded and unloaded Q factor and ratio of the coil element illustrated in FIG. 5A.

FIG. 5E illustrates a measured loaded $Q_L$ and unloaded $Q_U$ (quality) factor and ratio thereof of the coil element FIG. 5A under different stretching conditions. The quality factor was measured using a pickup probe when the coil element 10 was loaded with a phantom $Q_L$ and with the phantom $Q_U$. A quality ratio is defined as $Q_U/Q_L$. As shown in FIG. 5E, the quality ratio was around 2. This means that the majority of coil losses are coming that the phantom itself rather than the coil itself. The quality ratio is also relatively stable over the stretching conditions.

FIGS. 1A/1B illustrates one interdigital capacitor 15 in the coil. The number of interdigital capacitors 15 in a coil is not limited to one. Additionally, interdigital capacitors 15 may be added. The orientations of the different interdigital capacitors 15 may be different. The number and orientation of the interdigital capacitors 15 may be based on the expected stretching of the coil element 10. For example, if the coil element 10 is expected to be stretched in both an x-direction and a y-direction, the interdigital capacitors 15A and 15B may be perpendicular to each other.

Figure 6:
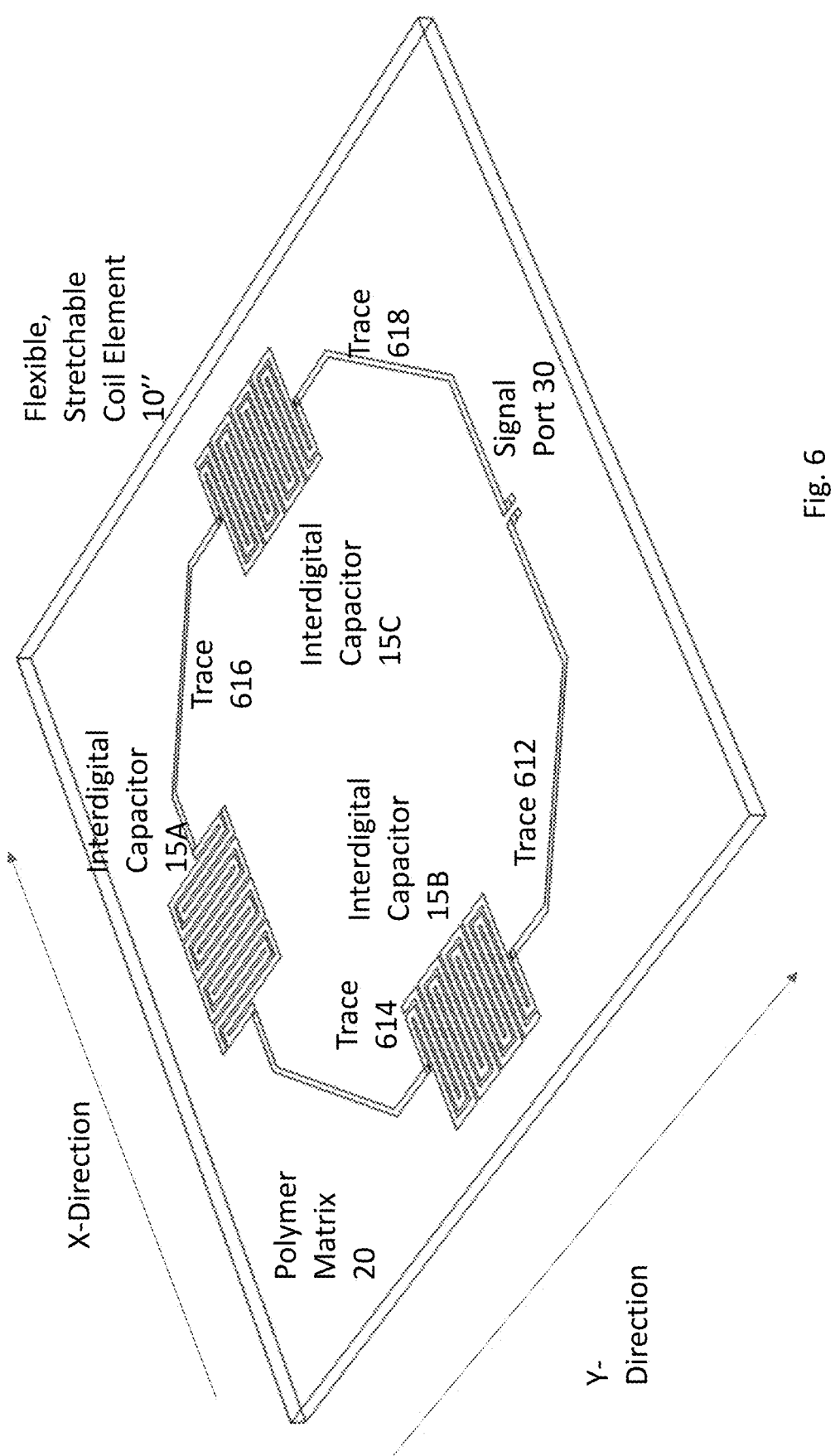
FIG. 6 illustrates a coil element having multiple interdigital capacitors in accordance with aspects of the disclosure.

FIG. 6 illustrates a coil element 10″ with a single coil having multiple interdigital capacitors 15A-15C. Three interdigital capacitors are shown for illustrative purposes. Interdigital capacitor 15A is perpendicular to interdigital capacitors 15B/15C. The x-direction and y-direction is shown in FIG. 6. The digits of interdigital capacitor 15A is perpendicular to the x-direction whereas the digits of interdigital capacitors 15B/15C are perpendicular to the y-direction. Thus, interdigital capacitor 15A may minimize the frequency shift for stretching in the x-direction and interdigital capacitors 15B/15C may minimize the frequency shift for stretching in the y-direction. Each interdigital capacitor 15 may be formed from pairs of traces. For example, interdigital capacitor 15B is formed of traces 612, 614, interdigital capacitor 15A is formed of traces 614, 616 and interdigital capacitor 15C is formed of traces 616, 618. Traces 612 and 618 are connected to the signal port 30. In an aspect of the disclosure, different interdigital capacitors may have different properties such as number of digits, digit length and inter-digit spacing. These properties may be based on the expected stretching in one or more directions. The properties may also be based on the expected use, e.g., body part, size of the patient and magnetic field source (operating frequency, etc).

In accordance with aspects of the disclosure, a different coil element 10, 10', 10" may be used for different body parts or different size patients. Thus, the properties described above including the interdigital capacitor(s) 15 may be customize for the body part or the size patient. Additionally, the properties may change based on the intensity of the magnetic field. For example, different magnetic fields may require different interdigital capacitance.

In an aspect of the disclosure, each digit of the interdigital capacitor 15 may have a U-shaped conductive path. In other aspects, each digit may be formed of single straight path.

Figure 7A:
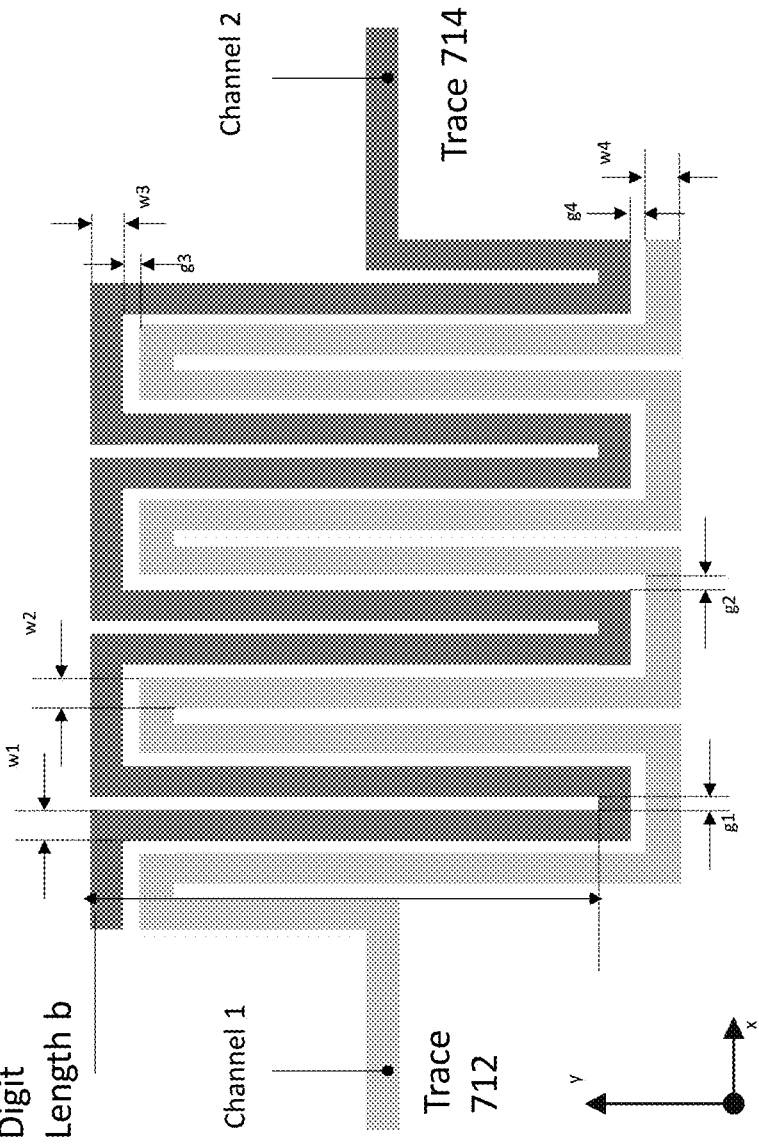
FIGS. 7A and 7B illustrate different trace patterns for the interdigital capacitor in accordance with aspects of the disclosure.

FIG. 7A illustrates an example of a fluid channel configuration for an interdigital capacitor 15 in accordance with aspects of the disclosure. One of the conductive traces 712 which forms the interdigital capacitor is channel 1 (fluid channel) and the other of the conductive traces 714 which forms the interdigital capacitor is channel 2 (fluid channel). FIG. 7A is a top view. The x and y directions are shown. Each fluid channel has a meandering conductive trace which is encapsulated in the polymer matrix 20. As shown in FIG. 7A, each meandering conductive trace has a plurality of U-shapes curves. W2 and W4 are the widths of the trace 712 in different directions, respectively. W1 and W3 are the widths of the trace 714 in different directions, respectively. In an aspect of the disclosure, the widths W2 and W4 may be the same. Similarly, in an aspect of the disclosure, the widths W1 and W3 may be the same. G1-G4 are different spacing between the traces (in the case of g1, it is the spacing between the sides of the U-shape. In an aspect of the disclosure, g2, g3 and g4 may be the same. The two fluid channels are spatially separated with the same electrically insulating polymer matrix 20.

Figure 7B:

FIG. 7B illustrates another example of a two fluid channel configuration for an interdigital capacitor 15 in accordance with aspects of the disclosure. One of the conductive traces 712' which forms the interdigital capacitor is channel 1 (fluid channel) and the other of the conductive traces 714' which forms the interdigital capacitor is channel 2 (fluid channel). Each fluid channel consists of a plurality of spatially separated lines positioned along y-axis connected to the same signal line in x-axis. The two fluid channels are spatially separated within the same electrically insulating polymer matrix 20.

In other aspects of the disclosure, the coil element may comprise multiple coil loops, where one coil loop is connected to a different MR image channel. The multiple coils form a RF coil array. The number of coils in the array may range from N=2 to N=32 or higher. The number of coils may only be limited by the number of MR image channels in the MRI system. Adjacent coils may overlap in the z-direction. This overlap may impact individual coil sensitivities. Thus, in accordance with aspects of the disclosure, the overlap is designed to sufficiently decouple the adjacent coils such that each individual coil's sensitivity is distinct and minimally affected by the presence of a neighboring element. In some aspects, the overlap may be between 10% to 30% of the loop area (at rest, e.g., not under a stretching).

In an aspect of the disclosure, an overlap range may be determined using a parameter such as a cross-talk S21 (or S12). The cross-talk is the impact of neighboring channels on each other. For example, S21 is a function of a transmitted power of a first channel and receiving power on a second channel (physically neighboring channel). The overlap distance may be set to minimize this value S21. In other aspects, an overlap range may be used such that the S21 value is less than a preset value. For example, the preset value may be 10 db.

Figure 8A:
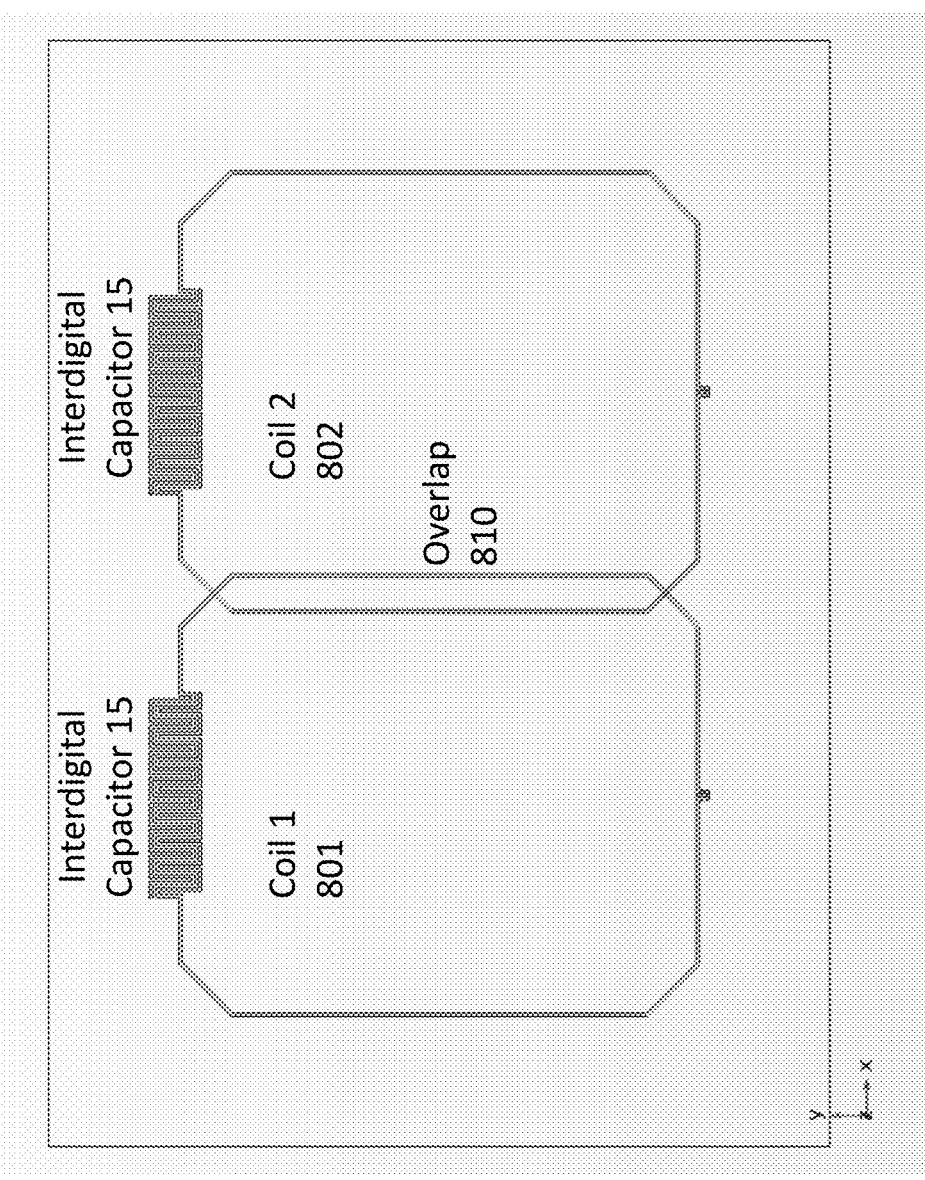
FIG. 8A illustrates an example of a multiple coil element in accordance with aspects of the disclosure having an overlap.
Figure 8B:
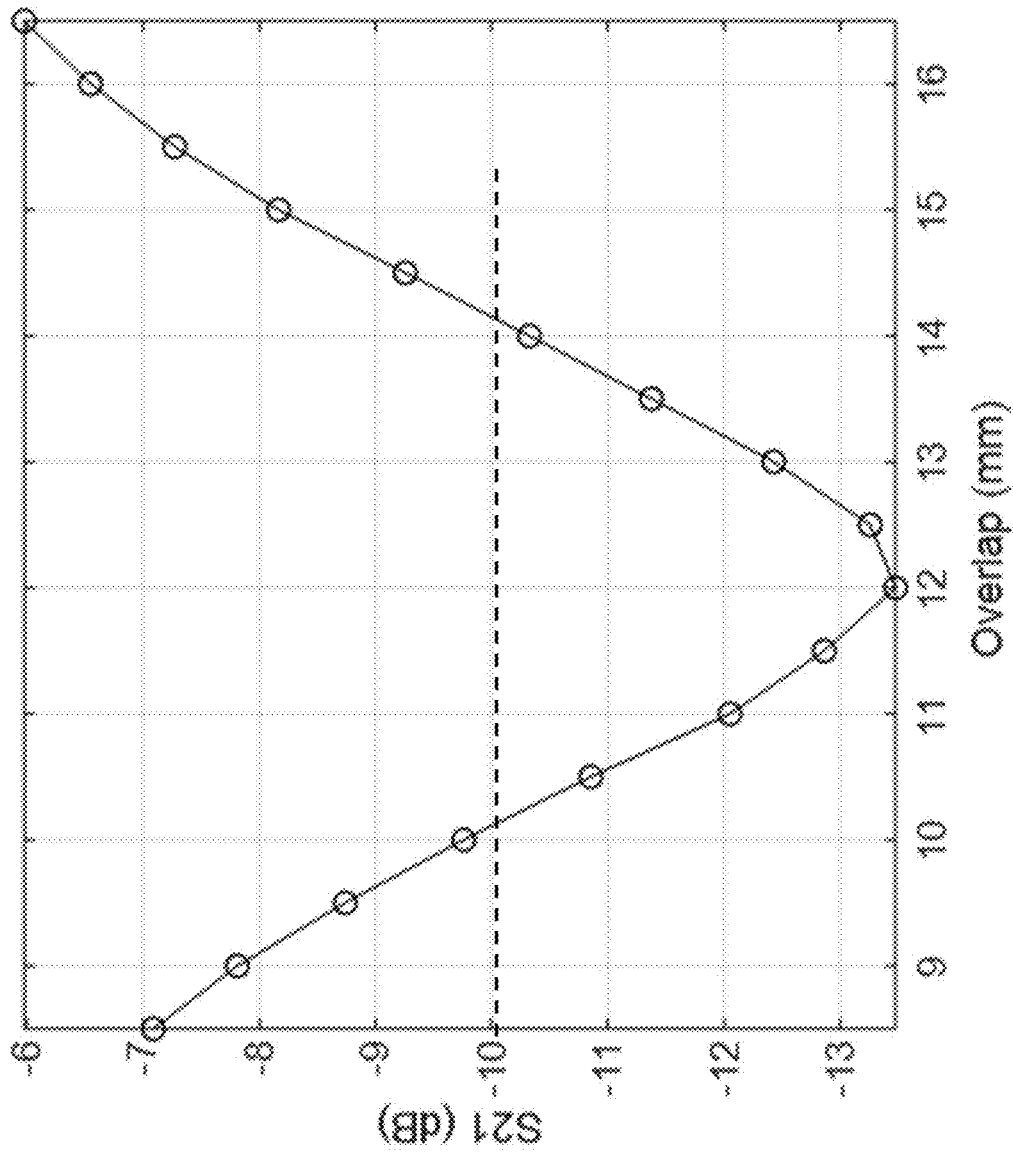
FIG. 8B illustrates a relationship between the overlap in the coil loops of adjacent coils and cross-talk.

The overlap value or range of values may be determined using a simulation. A full wave numerical simulation may be performed using the coil geometry and interdigital capacitor properties as described herein. A 7×6 cm rectangular loop may be used for each coil loop as the coil shape and area. 8 digits, each digit may have a digital length of 7 mm (B=7 mm), and the inter-digit spacing may be 0.5 mm. Additionally, the trace width may be 0.5 mm. For the simulation, two adjacent coils may be used such as shown in FIG. 8A (Coil 1 801 and Coil 2 802. In an aspect of the disclosure, the same overlap for each adjacent coil may be used. FIG. 8A illustrates two simulated coils Coil 1 801 and Coil 2 802 with an overlap 810. A homogenous phantom may also be simulated. The homogenous phantom may be rectangular and Coil 1 801 and Coil 2 802 simulated to be positioned on the same. The overlap 810 was varied from a predetermined minimum value to a predetermined maximum value. For example, the predetermined min/max may be 8 mm/17 mm. For a different size loop, the minimum and maximum may be different. At each varied overlap 810, the $S_{21}$ parameter was determined. FIG. 8B shows the relationship between the overlap and $S_{21}$. $S_{21}$ is on the y axis and overlap is on the x axis. As seen, $S_{21}$ is minimal about 12 mm. Therefore, in an aspect of the disclosure, the overlap 810 may be about 12 mm. A dashed line superposed on the curve is a predetermined threshold, e.g., −10 db. Therefore, in other aspects of disclosure, the overlap 810 may be between about 10 mm and about 14 mm for a coil and interdigital capacitor 15 having the above properties. The overlap may be different if the coil and interdigital capacitor 15 have different properties including dimensions.

Figure 8D:
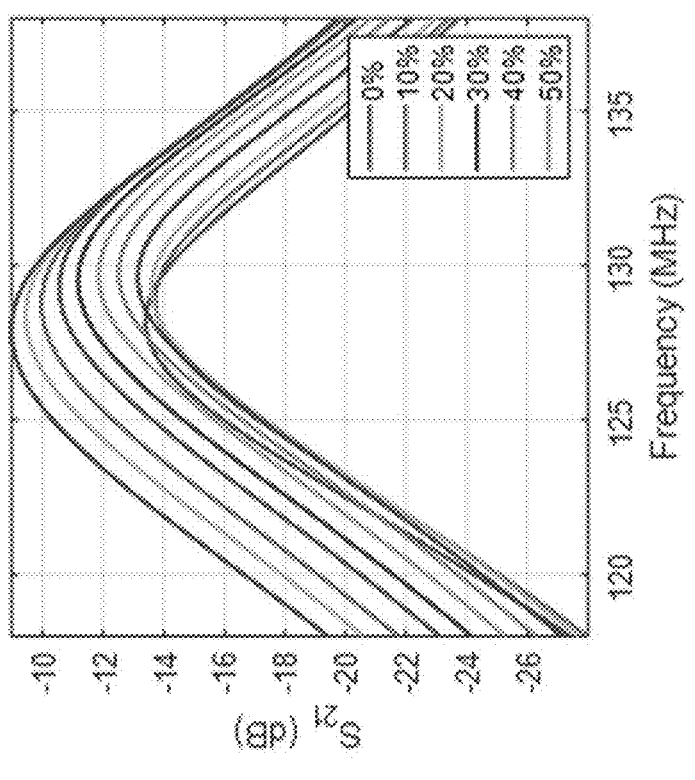
FIG. 8C and FIG. 8D illustrate simulation results for a two-coil element with a set overlap under different stretching conditions, where
Figure 8C:
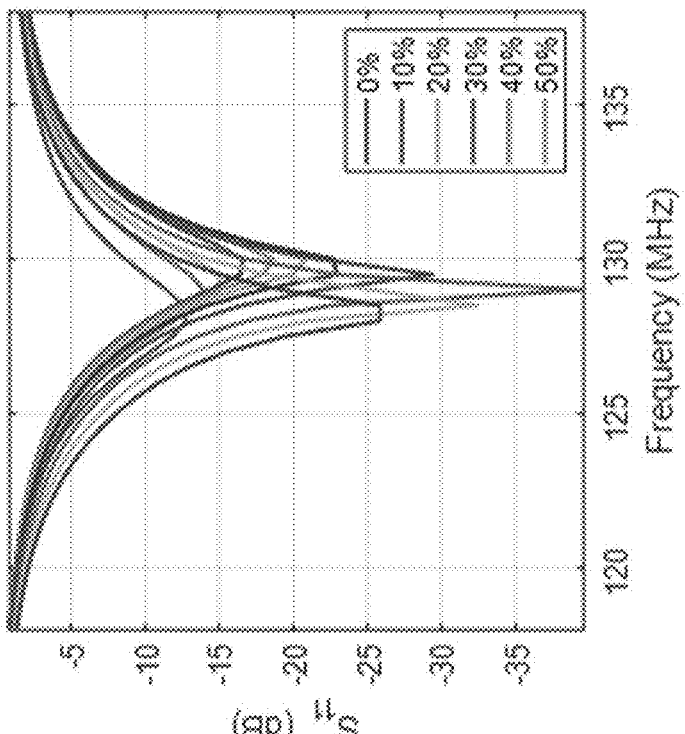

Coil 1 801 and Coil 2 802 overlapped by 12 mm was linearly stretched in the x-direction from 0% and 50% to confirm the relative stability of the coil tuning and decoupling. FIGS. 8C and 8D illustrate the simulated S values $S_{11}$ and $S_{21}$ under different stretching conditions (five different stretching conditions and no stretching, where there is a 10% difference between the stretching conditions). As can be seen in FIG. 8D, under a stretching condition of less than 40%, the maximum $S_{21}$ values is less than 10 dB (Around 128 MHZ-129 MHZ). $S_{11}$ is for Coil 1 801. However, both coils should have about the same $S_{11}$, $S_{22}$. Coil 1 801 resonance frequency shift was a maximum of about 2 MHz under the simulated stretching conditions.

In an aspect of the disclosure, the coil array (multiple coil element) may have a single layer or dual layers. In a single layer, each coil is in the same layer of the polymer, e.g., the coils are substantially planar. Jumper wire(s) may be used in the overlap region. In a dual layer element, adjacent coils are located in different layers, e.g., the coils alternate layers.

Figure 9:
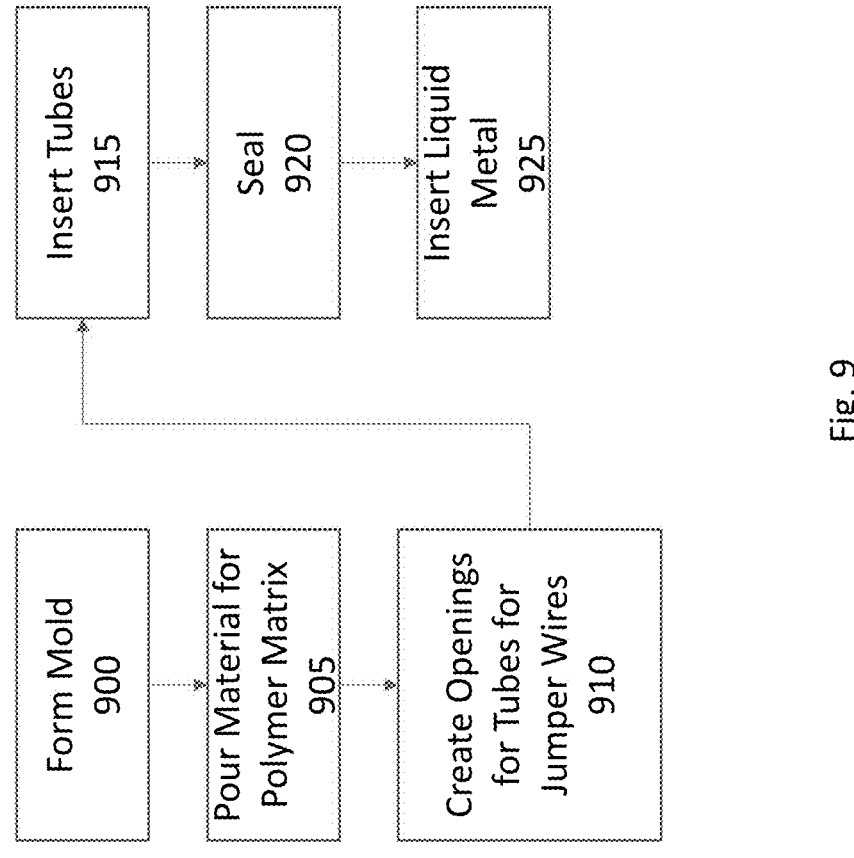
FIG. 9 illustrates a method for fabricating a single layer, multiple coil element in accordance with aspects of the disclosure.
Figures 10A, 10B:
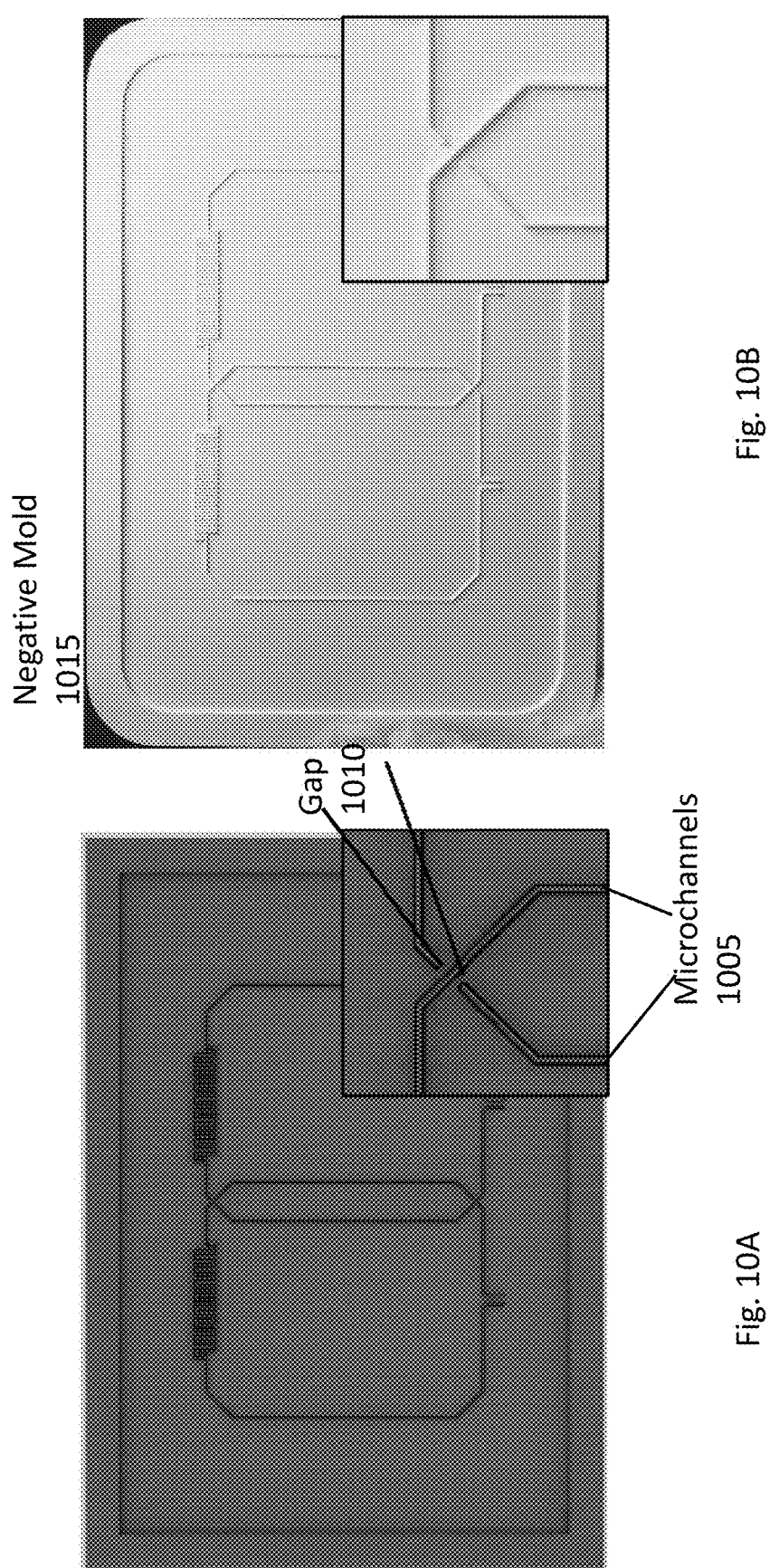
FIG. 10A illustrates a rendering of an example mold for a single layer, multiple coil element in accordance with aspects of the disclosure.
FIG. 10B illustrates an example of a mold fabricated based on the rendering in FIG. 10A.

FIG. 9 illustrates a method for fabricating a single layer, multiple coil element 1000 in accordance with aspects of the disclosure. A single layer, multiple coil element 1000 may be molded in a similar manner as described above. For example, the polymer matrix 20' and the layout of the microchannels 1005 may be formed by a mold at 900. For example, a 3D printer may be used to create plastic mold that contain a layout of a predetermined pattern for the conductive traces (and interdigital capacitor 15) microchannels 1005. This plastic mold is a negative mold 1015. The plastic mold may be made of a polylactic acid (PLA). The mold may have a preset height to provide a target thickness for one portion of the polymer matrix. FIG. 10A shows an example rendering of t for a two-coil element (single layer). A zoomed view of a portion of the overlapped region is shown in the inset. As can be seen in FIG. 10A, at the overlap region, there is a gap or break 1010 in the microchannel 1005. This is due to the coils being on the same layer. One of the coils has a break in the microchannel 1005 to avoid the liquid metal from different channels contacting each other. There would be a break at each crossing. In FIG. 10A, the zoomed view shows the gap 1010 for one of the crossings. Similar gap 1010 exists at the other crossing.

As can be seen in FIG. 10A, the coil loops may be aligned such that the interdigital capacitors 15 in each coil are aligned as viewed from the x direction. The large rectangle in FIG. 10A represents the dimensional of the element 1000 in the x and y directions, e.g., edge of the polymer matrix. FIG. 10B illustrates an example of a 3D printed negative mold 1015 having the microchannels 1005 and gap 1010 as shown in FIG. 10A. The polymer matrix 20 in FIG. 10B has rounded corners whereas in the rendering in FIG. 10A, the corners have straight edges. This is for making manufacturing easier. However, the corners may be rounded or have straight edges.

At 905, the material for the polymer matrix 1020 is provided (mixed if needed). For example, uncured Ecoflex® elastomer, may be prepared by mixing equal parts of its two components and degassing the mixture in a vacuum chamber to remove any air bubbles. The elastomer may be then poured into the negative mold 1015 and cured until fully solidified. The cured elastomer may be released from the negative mold. Another mold (not shown) may be used to create a flat sealing portion. The flat sealing portion be attached to the bottom portion with the microchannels 1005 that covers the patterned elastomer. The two portions may be bonded together to form a stretchable polymer matrix 1020 containing patterned microchannels. FIG. 10C illustrates an example of the stretchable polymer matrix 1020 with microchannels for two coils (multiple coils).

At 910, openings are created in the polymer matrix 1020 for the tubes for the jumper wires. In an aspect of the disclosure, the openings are in the flat sealing portion. The openings may be positioned at the edges of the microchannels just before the gaps 1010 start such that a continuous channel may be formed from the microchannels 1005 and the inner portion of the tube. The size of the opening may be based on the diameter of the tube. In an aspect of the disclosure, the tube may have the same diameter as the width of the microchannel. For example, the diameter of the tube may be 0.5 mm. For two coils (such as in FIG. 10C), there are four openings. In other aspects, instead of the sealing portion, the openings may be positioned on the bottom portion.

At 915, the tubes are inserted into the respective openings. In an aspect of the disclosure, the tube may be a thin flexible silicone tube. The length of the tube may be based on the length of the gaps 1010. The tube spans the length of the gaps in a crossing (e.g., one tube for the two gaps shown in the inset in FIGS. 10A/10C). For example, the tube may have a length of about 5 mm.

At 920, the openings and the tube may be sealed 1050 with a sealant to prevent leakage. For example, a silicone epoxy such as SilPoxy, by SmoothON, may be used. At 920, the liquid metal may be inserted into the microchannels 1005 and tubes. The liquid metal may be injected into the microchannels 1005 and tubes using a needle and a syringe. Similar to above, copper wires may be connected to the liquid metal.

Figure 10D:
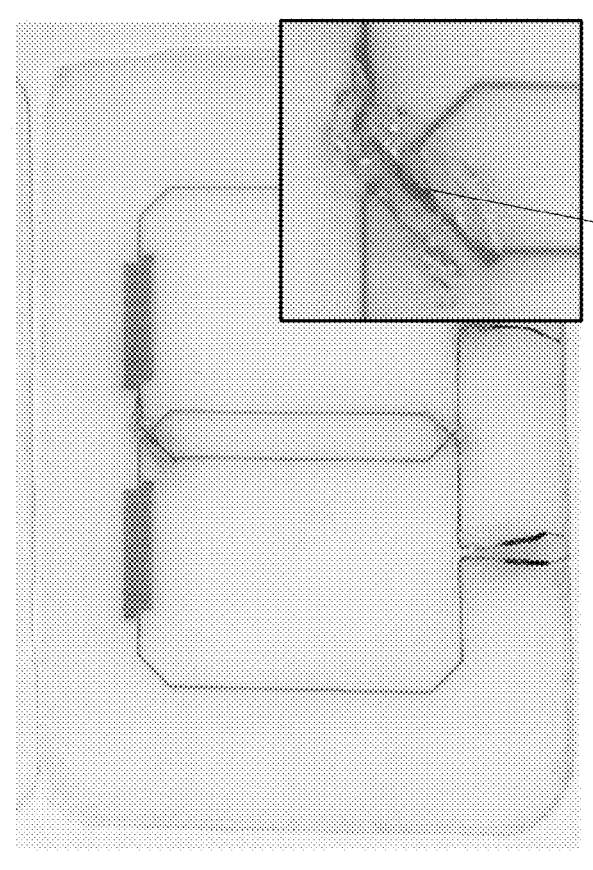
FIG. 10D illustrates an example of a single layer, two coil element in accordance with aspects of the disclosure.
Figure 10C:
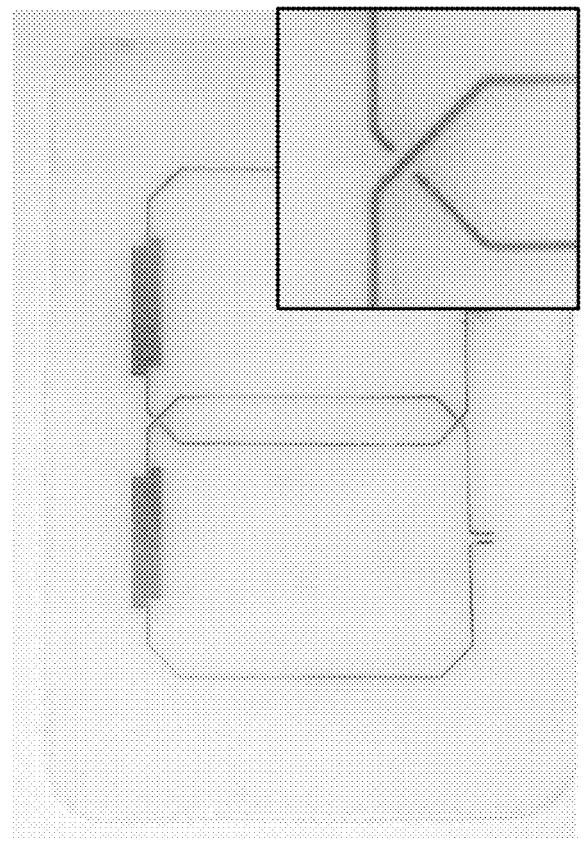
FIG. 10C illustrates an example of a single layer polymer with micro channels for a two-coil element fabricated using the mold illustrated in FIG. 10B in accordance with aspects of the disclosure prior to insertion of the tube for the jumper wire.

FIG. 10D illustrates an example of the single layer, two coil element 1000 with the tubes and sealant fabricated as described herewith. FIGS. 10A-10D show only two coils for descriptive purposes however, N coils may be used in a single layer and fabricated as described herein.

In other aspects, the coils may be configured in a dual layer. Adjacent coils may be located in different layers of the dual layers. For example, for a 5-coil element, coils 1, 3 and 5 may be in a first layer and coils 2 and 4 may be in a second layer. The second layer may be on top of the first layer (or vice versa). The coils for each layer may be separately fabricated and subsequently overlayed. The distance between each coil in the same layer may be set such that the above target overlap 810 may be maintained. For example, each layer may have an extended area where there are no microchannels. This extended area may face the microchannels from the other layer.

Figure 11B:
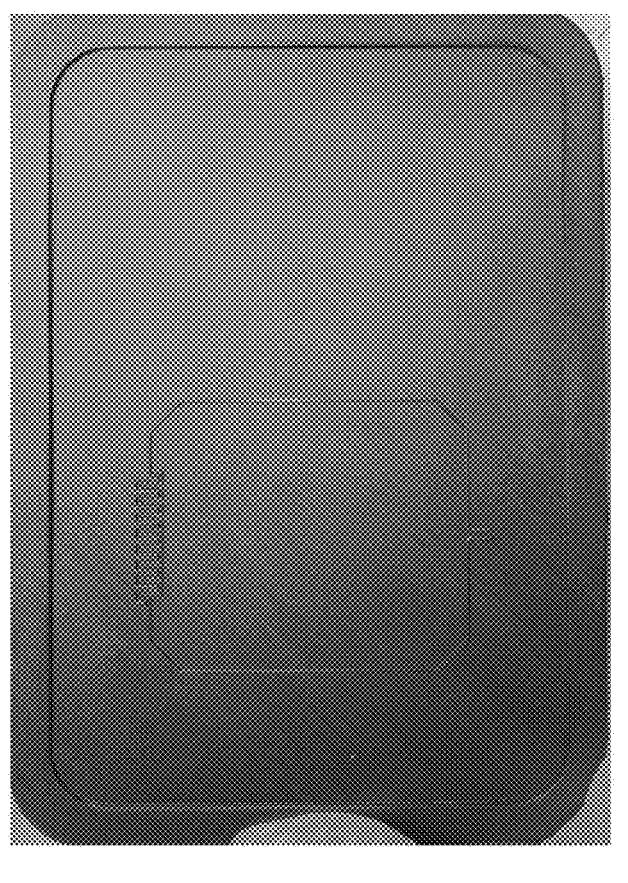
FIG. 11B illustrates an example of a mold fabricated based on the rendering in FIG. 11A.
Figure 11A:
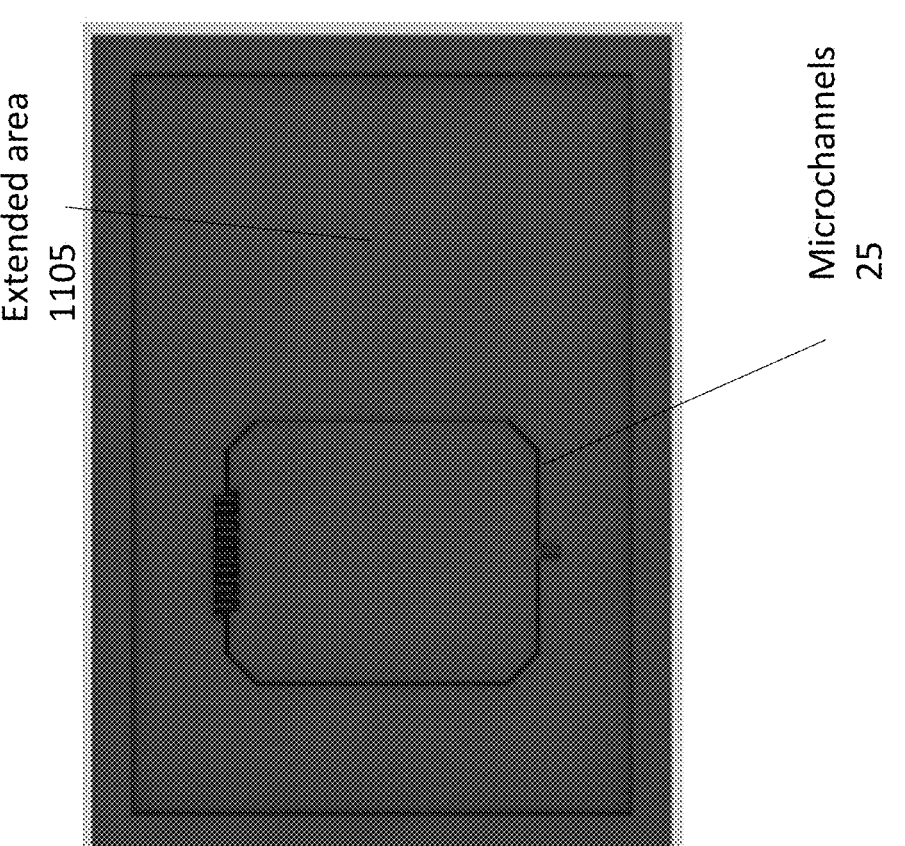
FIG. 11A illustrates a rendering of an example of a mold for a dual layer, multiple coil element in accordance with aspects of the disclosure.
Figure 11D:
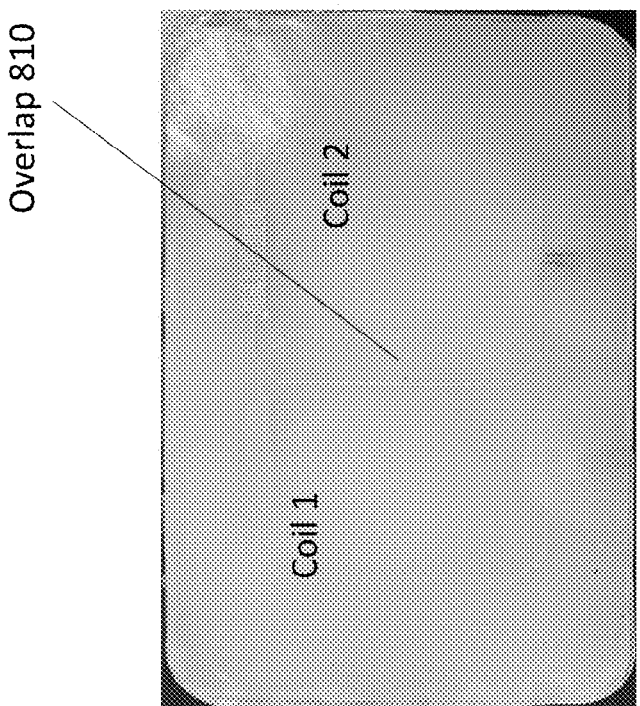
FIG. 11D illustrates an example of a dual layer, two coil element in accordance with aspects of the disclosure.
Figure 11C:
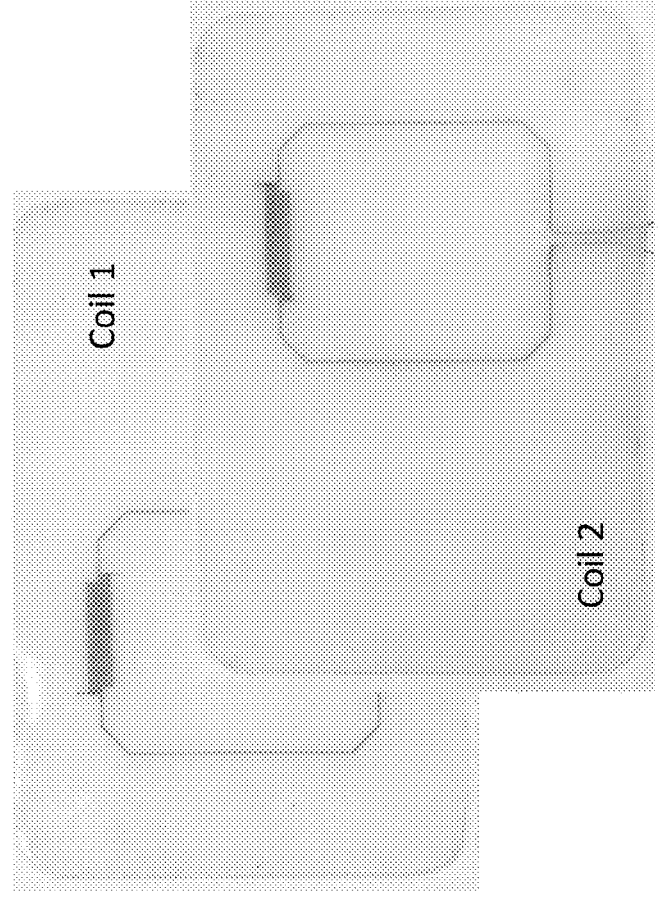
FIG. 11C illustrates two separate coil elements which will be overlayed to create a dual layer, multiple coil element in accordance with aspects of the disclosure.

FIG. 11A shows a rendering of a mold for a dual layer, multiple coil element 1100. As can be seen in FIG. 11A, there is an extended area 1105 were the microchannels 25 are not located. FIG. 11B illustrates an example of a mold for the dual layer, multiple coil element 1100 corresponding to the rendering in FIG. 11A. Once again, the mold in FIG. 11B has rounded corners to make fabrication easier. However, in other aspects, the mold may have straight edges such as shown in the rendering in FIG. 11A. FIG. 11C shows an example of two coil elements (single coil elements) separately fabricated. Coil 1 is on a first layer and Coil 2 is on a second layer. The extended area 1105 on the first layer faces the microchannels 25 on the second layer and vice versa. For example, as shown in FIG. 11C, the microchannels of Coil 1 face the extended area 1105 in the second layer. FIG. 11D shows an example of a dual layer, multiple coil element 1100 with two coils. As can be seen the coils are positioned such that there is the target overlap 810.

Figure 12:
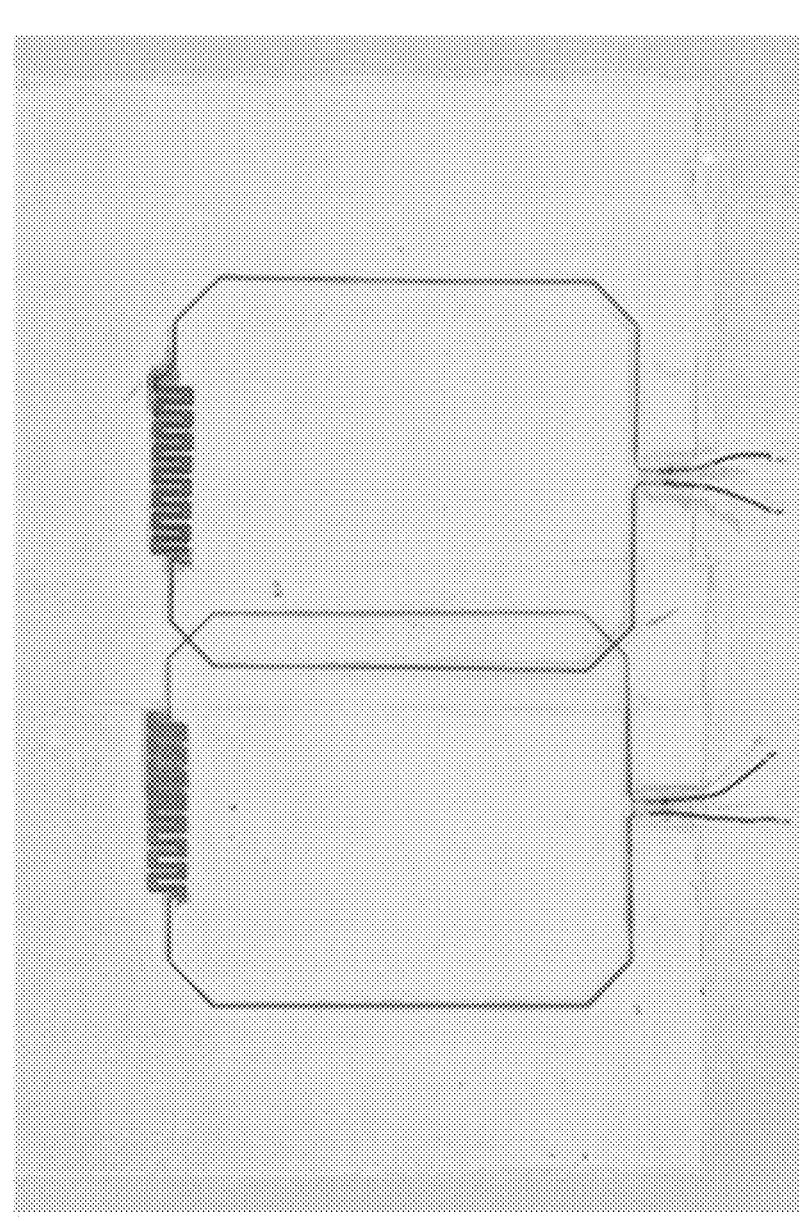
FIG. 12 illustrates an example of a dual layer, two coil element in accordance with aspects of the disclosure fabricated using Direct ink writing.
Figure 13P:
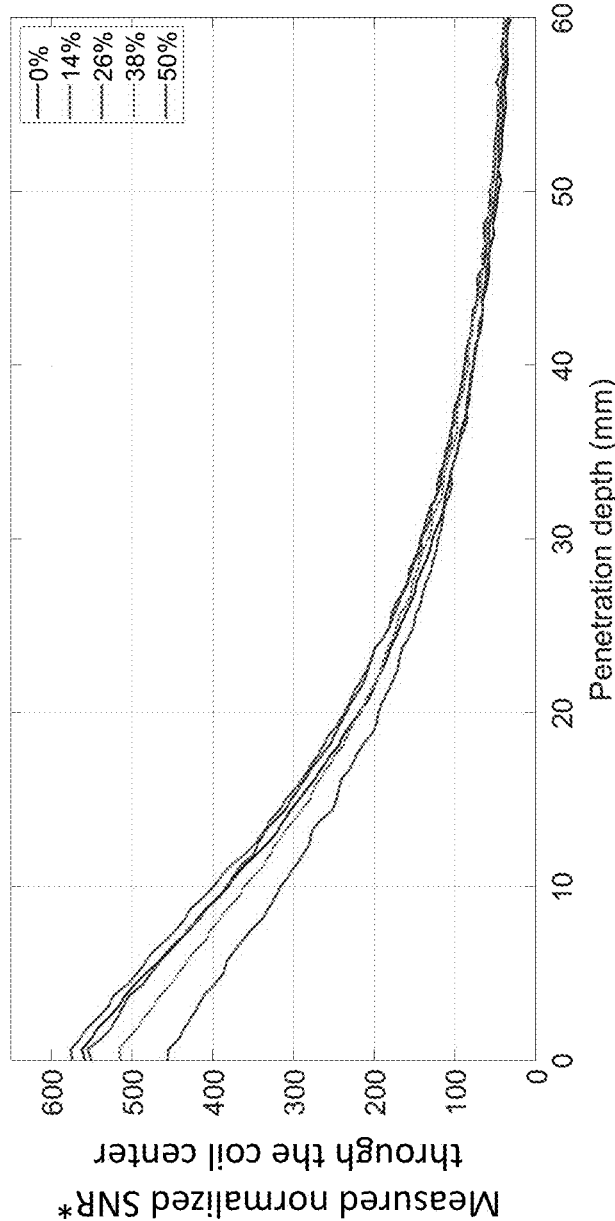
FIG. 13P illustrates a normalized SNR measured through a central of the coil in accordance with aspects of the disclosure into the phantom.

In other aspects of the disclosure, instead of molding the dual layer element, the dual layer element 1100' may be fabricated via DIW in a similar manner as described above such that the dual layer element is thinner. For example, the microchannels for each coil of the same layer may be disposed on the spin coated silicone. The thin seal portion may be positioned on top of the microchannels 25 for each coil. The process may be repeated for the other layer. Once again, the spacing between microchannels may be set to achieve the target overlap 810. Each layer may include the extended area 1105 facing the microchannels 25 of the other layer to achieve the target overlap 810. FIG. 12 illustrates an example of a dual layer, multiple coil element 1100' fabricated using DIW (two coils). FIG. 12 also shows the copper wired connected to the liquid metal for each coil (which will also be attached to the respective MR image channel.

As described above, a material, such as a contrast agent may be added to the polymer material to suppress signal. This may be used to reduce a brightness that the coil element is seen on the MR image (or make the coil element invisible). Although, this does not influence the quality of the images, radiologists are not used to seeing coil elements on the MR images. An intensity of a signal (such as for a gradient-recalled-echo (GRE) sequence) is based on relaxation times T1 and T2. Certain contrast agents may change the relaxation timing. For example, a Gd contrast agent facilitates relaxation of nearby hydrogen protons and shorten both T1 and T2. However, for T1 shortening, the signal intensity is increase but for T2 shortening (especially at a high concentration of Gd, the signal intensity decreases. The amount of dopant used may be based on a target reduction of the signal intensity. For example, the volume ratio of material such as Magnevist to Ecoflex® may range from 1:10 to 2:10,000. For example, the ratio may be 5:100.

Additional Simulation and Measurement

Single coil elements and multiple coil elements as described herein were used in simulation and measurements for determining SNR under certain stretching conditions. FIGS. 13A-13E illustrate simulation results for a B-field for a single coil element on a simulated phantom. The following properties of the coil were used in the simulation: rectangular loop that is approximately 6 cm×7 cm, the interdigital capacitor has 8 digits, each digit length of 7 mm, and the inter-digit spacing of 0.5 mm, trace width 0.5 mm. Ecoflex® was the polymer and cuGaIn was the liquid metal, no dopant. The phantom was a homogenous rectangular phantom that represented average tissue properties. Sensitivity B1 field profile at a central axial cross-section is shown in FIGS. 13A-13E. The stretching conditions were 14%, 26%, 38% and 50% (and no stretching FIG. 13A). As can be seen in FIGS. 13A-13E, the coil sensitivity was relatively unaffected by stretching. Although, while there was a slight decrease in sensitivity (at the center), the coil is able to cover a larger area when stretched and maintain the performance, e.g., 0.75+−0.06 µT at the surface.

A single coil element, fabricated as described above and having the same properties as the simulation (properties were selected for a target stretching of 30%), was placed on the phantom and gradually stretched from 0% (FIG. 13F) to 50% (FIG. 13J). FIGS. 13F-13J show the SNR maps obtained under different stretching conditions. As seen in FIGS. 13F-13J, the polymer and liquid metal appear on the image. The two points of hyperintensity correspond to edges of the liquid metal coil. As can be seen in FIGS. 13F-13J, the SNR is maintained when stretching up to 30%, e.g., SNR=516+−46 at the surface of the phantom. This is an approximate variance of 9% within the target stretching range. Of note, even beyond the target stretching range >30%, the SNR is maintained as providing a useful image, where the SNR is comparable to a commercially available rigid coil.

FIGS. 13K-13O illustrates normalized SNR maps. SNR is a function of the dimension of the coils, thus SNR is expected to decrease with a coil stretch. The normalization was with respect to the size of the coil. FIGS. 13K-13O also show a stable SNR (normalized) performance. FIG. 13P shows a normalized SNR measured through a central of the coil into the phantom. For stretching less that 30%, the normalized SNR varied only about 2% (561+−12).

Figures 14D, 14E, 14F:
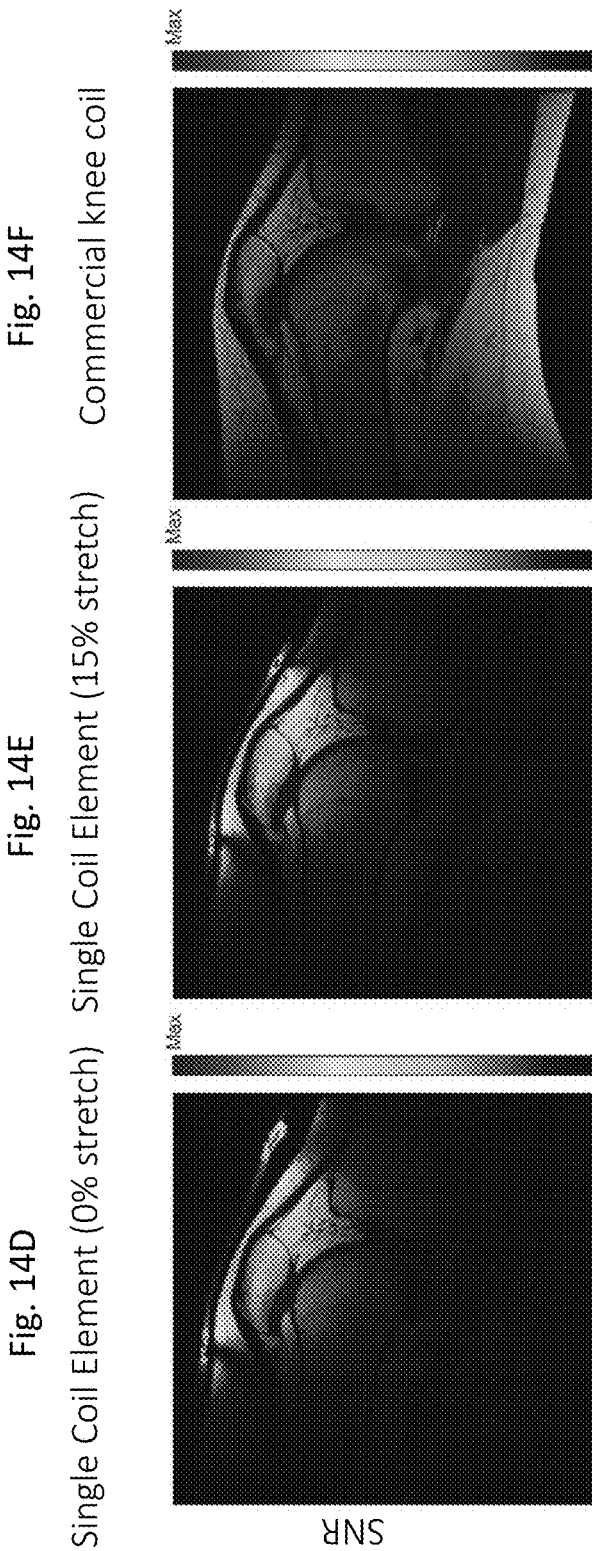
FIGS. 14D-14F are corresponding SNR maps of the same sagittal slices where FIG. 14D corresponds to FIG. 14A, FIG. 14E corresponds to FIG. 14B and FIG. 14F corresponds to FIG. 14C.

The performance of the single coil element fabricated in accordance with aspects of the disclosure (rectangular loop that is approximately 6 cm×7 cm, the interdigital capacitor has 8 digits, each digit length of 7 mm, and the inter-digit spacing of 0.5 mm, trace width 0.5 mm. Ecoflex® was the polymer and cuGaIn was the liquid metal, no dopant) was compared with a commercial knee coil. The commercial knee coil had a dedicated 8-channel knee coil. Sagittal fast spin echo images of a healthy knee were acquired with the single coil element under no stretching and a 15% stretching. Only a portion of the knee is visible using the single coil element (single channel surface coil) and opposed to with the 8-channel commercial knee coil which is a volume multi-channel coil. FIGS. 14A-14C show the fast spin echo images, where FIG. 14A is acquired using an unstretched single coil element described herein, FIG. 14B is acquired using a 15% stretched single coil element described herein and FIG. 14C was acquired using the 8-channel commercial knee coil. Each figure is annotated with two rectangles. The smaller rectangle is for a specific SNR comparison. The SNR was 282, 288 and 179, respectively for FIGS. 14A, 14B and 14C (at the small rectangle). This corresponding to a 60% SNR increase over the 8-channel commercial knee coil. The larger rectangle highlights the improved SNR. It is noted that the single coil element is shown in FIGS. 14A/14B but not shown in FIG. 14C. FIGS. 14D-14F are corresponding SNR maps of the same sagittal slices. These maps clearly demonstrate the improved SNR of the single coil element described herein over the 8-channel commercial knee coil (Dedicated). As can be seen in FIGS. 14D-14DF (in the area corresponding to the larger rectangle), there is a significant improvement in the SNR. This significant improvement is due to the conformal design of the stretchable coil.

Figures 15A, 15B, 15C, 15D, 15E, 15F, 15G:
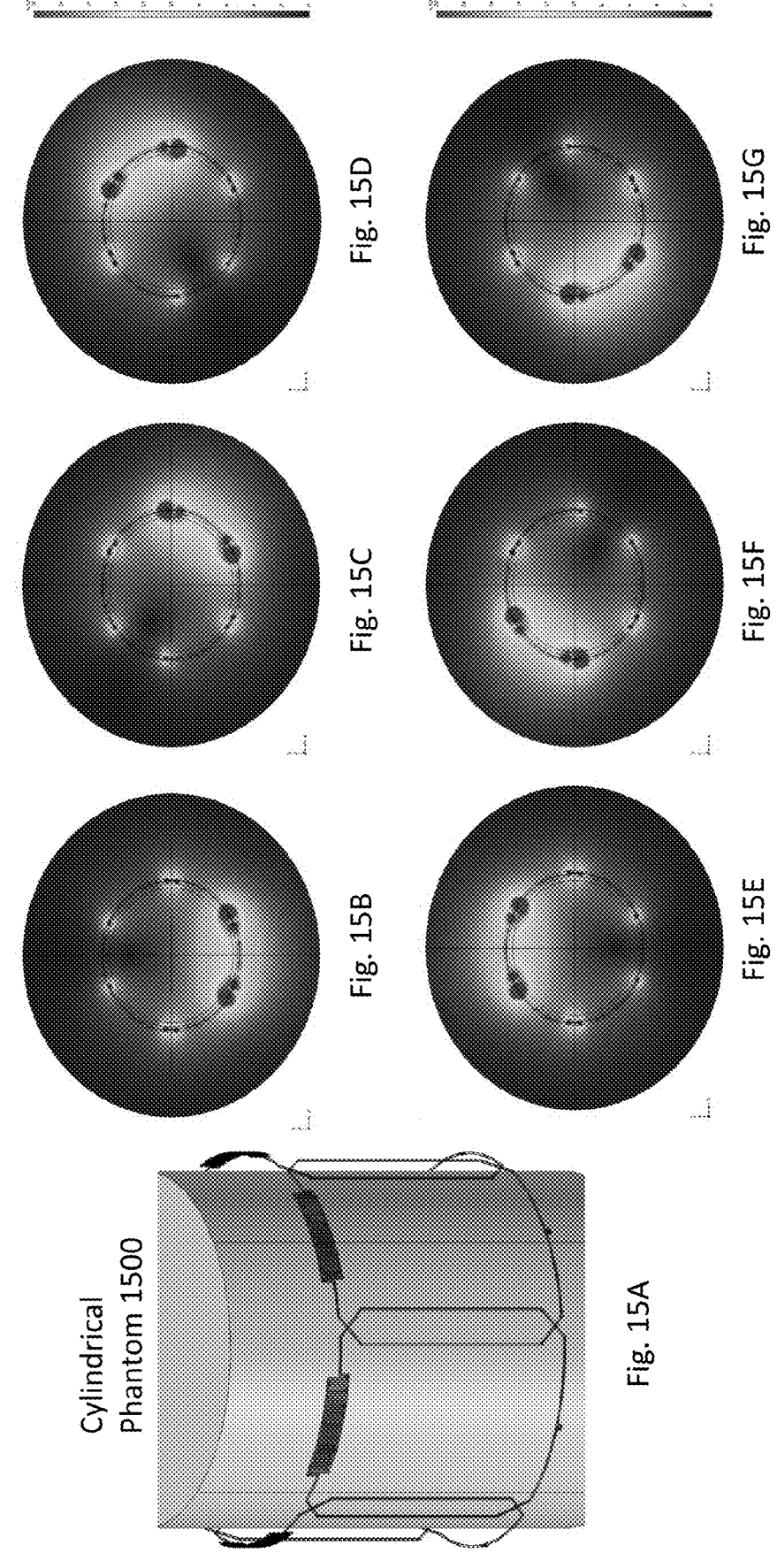
FIGS. 15A/16D illustrate simulation results for a multiple coil element on a curved phantom in accordance with aspects of the disclosure, where
FIGS. 15B-15G illustrate the sensitivity when different coils of the dual layer, multiple coil element are excited

FIG. 15A illustrates a simulation of six coils on a cylindrical phantom 1500 (multiple channel coil element or coil array). The coils were simulated equidistant from each other on the homogenous cylindrical phantom. FIGS. 15B-15G illustrate individual sensitivity profiles for each coil. The coils were simulated as a dual layer, multiple coil element as described herein. Coil 1, 3, 5 was on one layer and coil 2, 4, 5 was on another layer of the polymer matrix. Each coil was simulated to have the same properties as described above. In FIGS. 15B-15G, a different coil was excited to separately test the output of each coil and cross-talk between coils. As shown in FIGS. 15B-15G, each coil has similar sensitivity. Additionally, FIGS. 15B-15G show a slight presence of cross-talk when one of the coils is excited. For example, in FIG. 15B, when one of the coils is excited, the adjacent coils exhibit a small sensitivity as shown by the shading (whereas non-adjacent coils only exhibit minimal sensitivity).

Figures 16A, 16B, 16C, 16D:
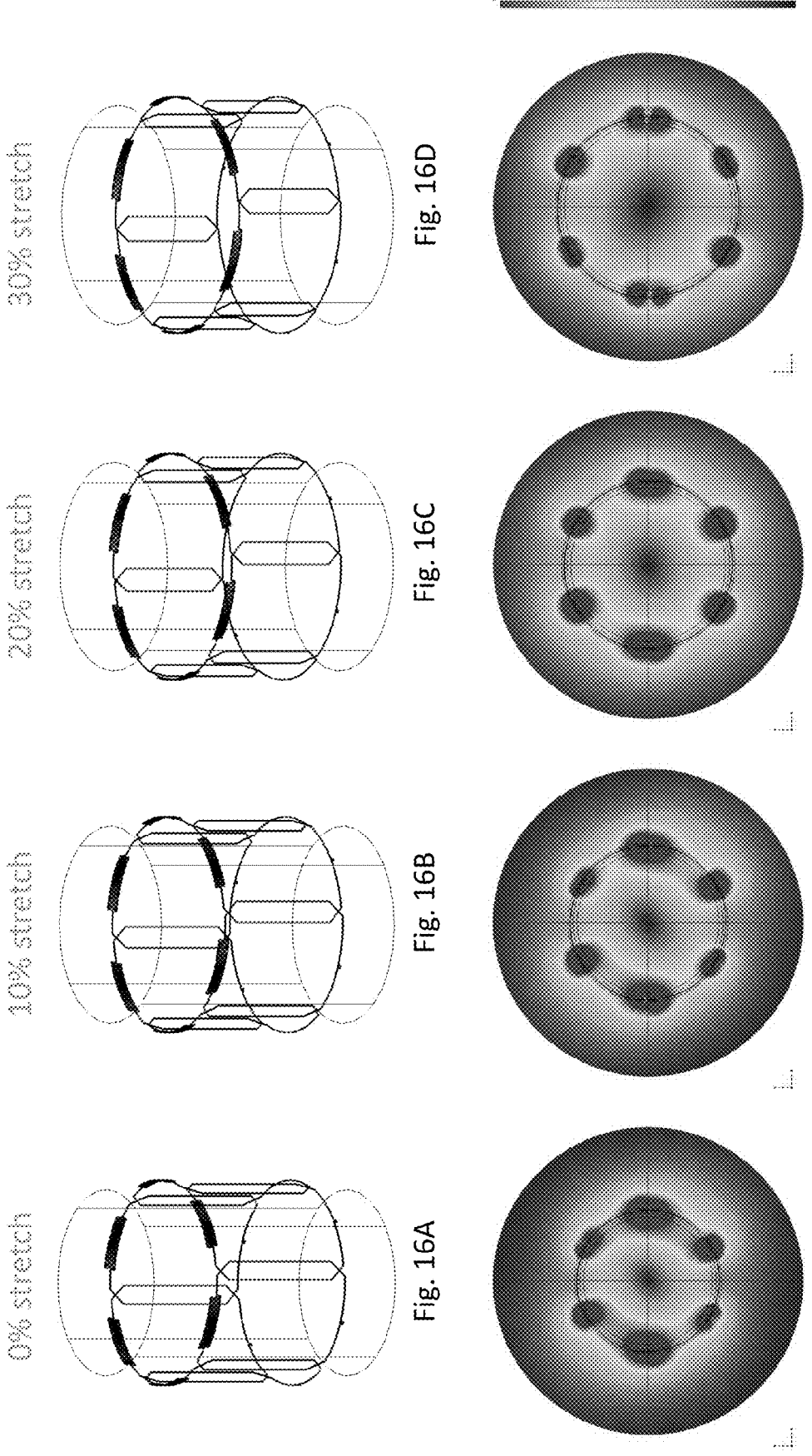
FIGS. 16A-16D illustrate the sensitivity under different stretching conditions, 0%, 10%, 20% and 30%, respectively, when all the coils are excited.

FIGS. 16A-16D illustrate simulated sensitivity maps when the coils are under different stretching conditions where all of the coils were excited. FIG. 16A illustrates no stretching (0%); FIG. 16B illustrates a 10% stretching; FIG. 16C illustrates a 20% stretching and FIG. 16D illustrates a 30% stretching. FIGS. 16A-16D demonstrate that the stretching of coil elements described herein assembled as a coil array can maintain good sensitivity while being stretched. These figures also demonstrate that the coil elements (coil array) work on curved surfaces.

FIGS. 17A-17F show a comparison of measured results from a multiple coil element fabricated with different techniques in accordance with aspects of the disclosure on a phantom. Each coil element had two coils. In FIG. 17A/FIG. 17D, a single layer, two coil element was used (molded) (SL); in FIGS. 17B/17E, a dual layer (also referred to as double layer), two coil element was used (molded) (DL) and in FIGS. 17C/17F, a dual layer, two coil element was used (DL-DIW). Each coil element had the same properties as described above. Coils were positioned on a standard rectangular silicone phantom (W=22 cm, L=33 cm, H=16 cm) for imaging at 3T (GE Healthcare, MR750). A 3D spoiled gradient echo sequence was used (TR=6.3 ms, TE=2.4 ms (in phase), FOV=20 cm, pixel size 0.8×0.8, FA=12 deg. BW=31.3 kHz, slice thickness=1 mm, NEX=1). SNR maps of the coils are shown in FIGS. 17A-17C (measured through a central axis slice). In the SNR maps, three lines are added, two vertical lines and one horizontal line. One of the vertical lines is through the center of the left coil and the other is through the center of the right coil. The horizontal line is 1 cm away from the surface of the phantom. FIG. 17D shows the SNR along the left vertical line, FIG. 17E shows the SNR along the right vertical line and FIG. 17F shows the SNR along the horizontal line, where the SNR is shown for all three coil elements (SL, DL, and DL-DIW). The elements (SL and DL) are clearly seen in FIGS. 17A and 17B but only slightly seen in FIG. 17C as expected as the DL-DIW is much thinner. The DL is more visible in the image (see FIG. 17B verses FIG. 17A). The figures also demonstrate the fabrication techniques provide similar sensitivity maps.

The performance of the DL-DIW fabricated in accordance with aspects of the disclosure was compared with a commercial knee coil. The commercial knee coil had a dedicated 8-channel knee coil array. Axial and sagittal images were obtained. Images were acquired with the DL-DIW under no stretching and 15% stretching. FSE sequence with the following parameters was used: TR=4500 ms, TE=8.2 ms, FOV=18 cm, pixel size 0.4×0.6, ETL-9, BW=83.3 kHz, NEX=1, slice thickness=1 mm. FIG. 18A is an image acquired using the commercial knee coil (FIG. 18D is a corresponding SNR map). FIG. 18B Is an image (identified as Dual-channel coil) acquired using the DL-DIW not stretched (FIG. 18E is a corresponding SNR map). The unstretched dimension is 124 mm. FIG. 18C is an image acquired using the DL-DIW stretched 15% (FIG. 18F is a corresponding SNR map). As can be seen in FIGS. 18A-18C the signal intensity is improved using the DL-DIW element over the commercial knee coil (especially near the conformal coil element) (image is brighter). This was expected as the DL-DIW is tightly conforming to the knee anatomy.

A rectangle has been added to each of the SNR maps (FIGS. 18D-18F) for comparison basis. The SNR increased using the DL-DIW over the commercial knee coil. For example, the SNR for the commercial knee coil was 40 which increased to 52 for the DL-DIW (unstretched) and 60 (stretched by 15%). SNR improvement of the DL-DIW is up to 50% compared to the dedicated commercial knee coil.

The effect of doping the polymer was tested by varying the concentration of the dopant in the polymer. A Ecoflex® polymer was used. The dopant with Magnevist (Gd contrast agent). Samples were prepared by mixing different volume ratios of the contrast agent with the Ecoflex®. Each mix was placed in separate test tubes. Specifically, all samples were degassed in a vacuum chamber to remove air bubbles and transferred to graduated plastic test tubes and cured at room temperature. Nine doped samples and one pure sample (no dopant) were prepared having the following concentration ratio (1) 2:10,000; (2) 5:10,000; (3) 1:1,000; (4) 2:1,000; (5) 5:1,000; (6) 1:100; (7) 2:1000; (8) 5:100;' and (9) 1:10.

The samples were placed equidistantly around a standard homogeneous cylindrical phantom. The outside diameter was 9.5 cm and length were 30 cm. the samples were also positioned inside a 32-channel head coil. A 3T MRI scanner was used. A region of interest was identified to determine the average signal intensity. Single axial slices with spine-echo (SE) sequence were acquired (TR=1500 ms, slice thickness 5 mm, 32 TEs from 8.3-133 ms).

Figure 19:
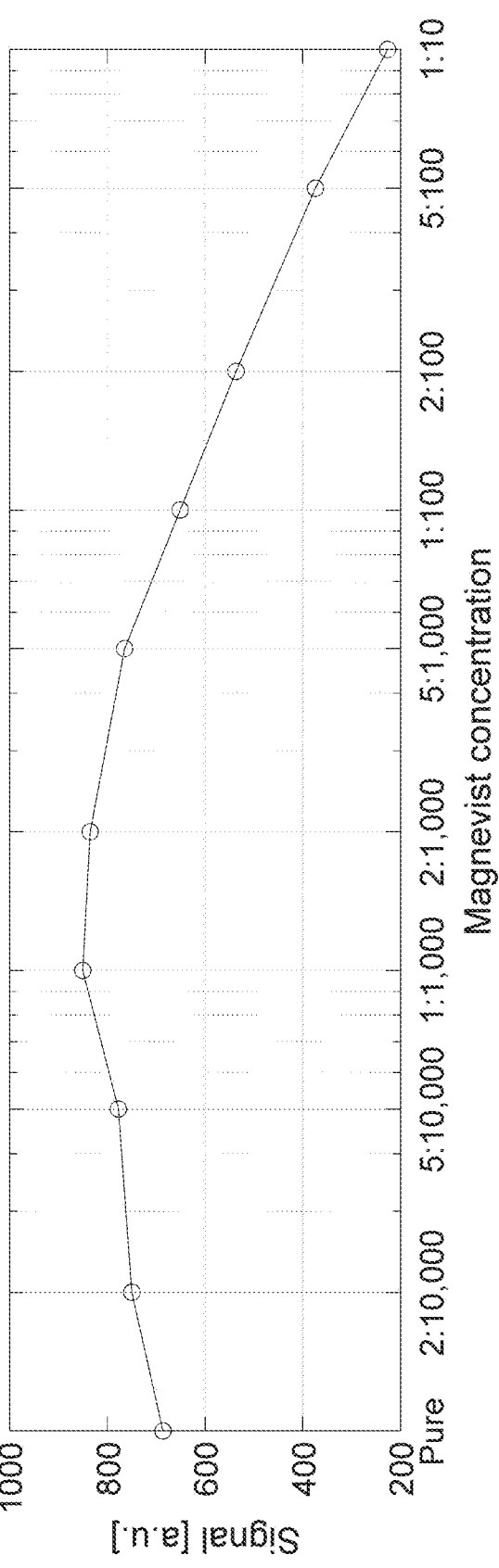
FIG. 19 illustrates results of signal strength measurements based on different ratios of dopant and polymer.

FIG. 19 illustrates the results from the nine doped samples and one pure sample at TE=33.2 ms. The sample concentration is on the x-axis and the signal strength is on the y-axis. The signal strength initially increased as the concentration increased from pure to 1:1,000 (24% increase). However, above this concentration, the signal strength decreased (to only 30% of the initial signal strength with no dopant at 1:10). This was expected as T1 and T2 changes with eventually the change in T2 causing the signal strength to decrease.

Three single coil elements were fabricated as described above with different concentrations of dopant: (1) pure Ecoflex® (no dopant); (2) 5:100; (3) 1:10. The coil geometry for the three single coil elements were the same. Each of the single coil elements were placed on a rectangular phantom. The 3T MRI scanner was used.

Figures 20A, 20B, 20C:
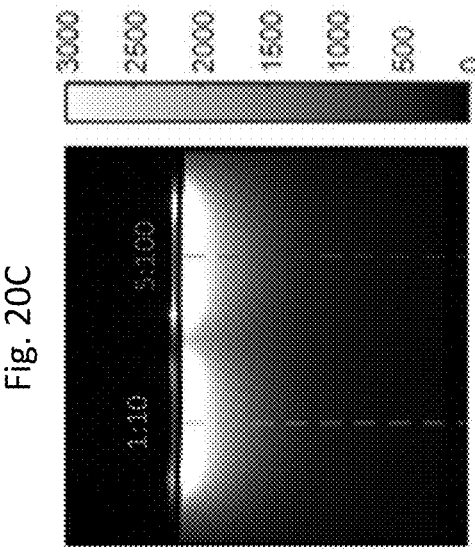
FIGS. 20A-20I illustrate results of different comparisons of pairs of single coil elements with different dopant concentrations in accordance with aspects of the disclosure, where

FIGS. 20A-20C shows SE images of the homogenous phantom. In FIG. 20A, an SE mage from a single coil element made of pure Ecoflex® (right side of FIG. 20A) is compared with an SE image from a single coil element made with a ratio of 5:100 for the polymer matrix (left side of FIG. 20A). In FIG. 20B, an SE mage from a single coil element made of pure Ecoflex® (right side of FIG. 20B) is compared with an SE image from a single coil element made with a ratio of 1:10 for the polymer matrix (left side of FIG. 20B). In FIG. 20C, two SE images are compared from different single coil elements made with different ratios (1:10 left side of FIG. 20C; 5:100 right side of FIG. 20C).

As seen in FIGS. 20A-20C, the signal coil element doped with Magnevist were less visible on the MR images, yielding an image signal reduction of up to 83% and 92% for 5:100 and 1:10 ratios, respectively.

Figure 20F:
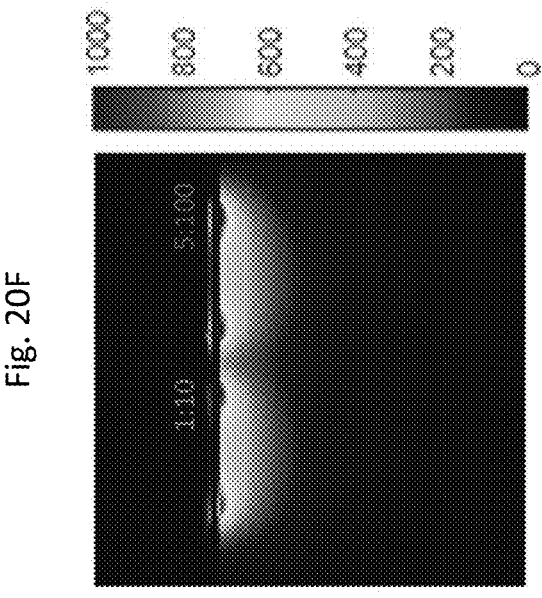
Figure 20E:
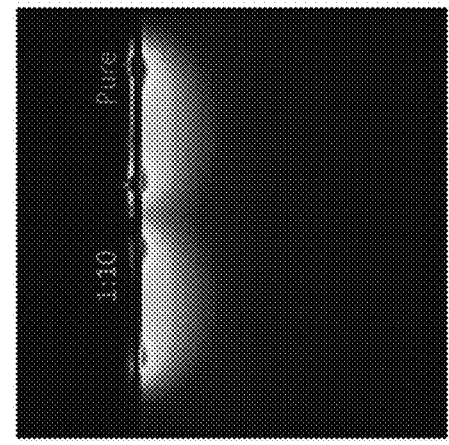
Figure 20D:
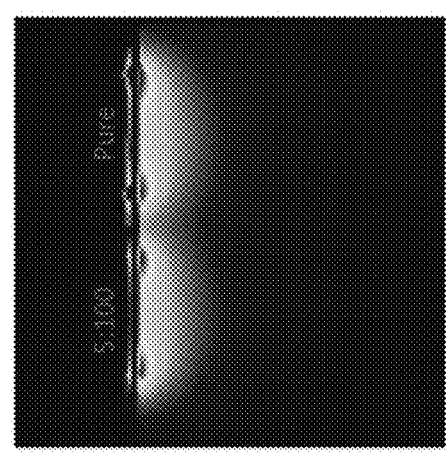

FIGS. 20D-20F illustrate corresponding SNR maps: FIG. 20D corresponds to FIG. 20A; FIG. 20E corresponds to FIG. 20B; and FIG. 20F corresponds to FIG. 20C. The SNR was calculated by dividing the SE images was a standard deviation of the background noise. As can be seen in FIGS. 20D-20F, the SNR remained stable for all three single element coils (426+−5). The SNR maps also show that the coil element without dopant is more visible.

Figures 20G, 20H, 20I:
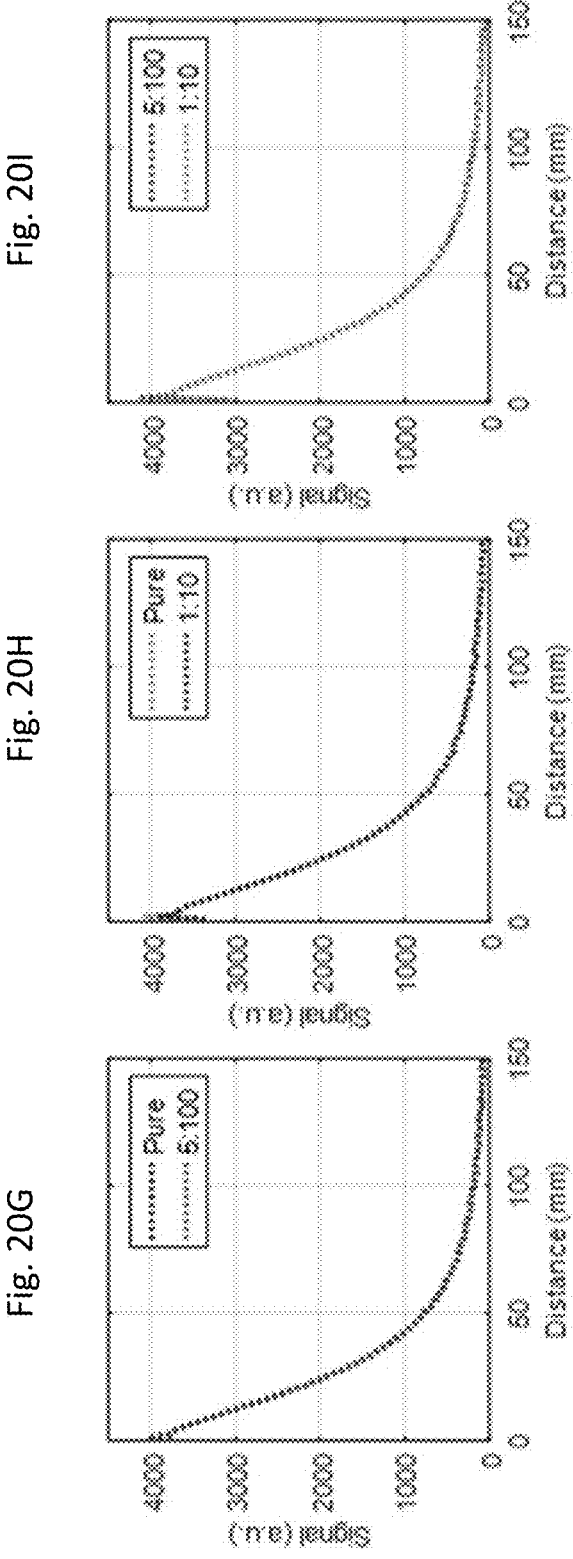
Figure 21:
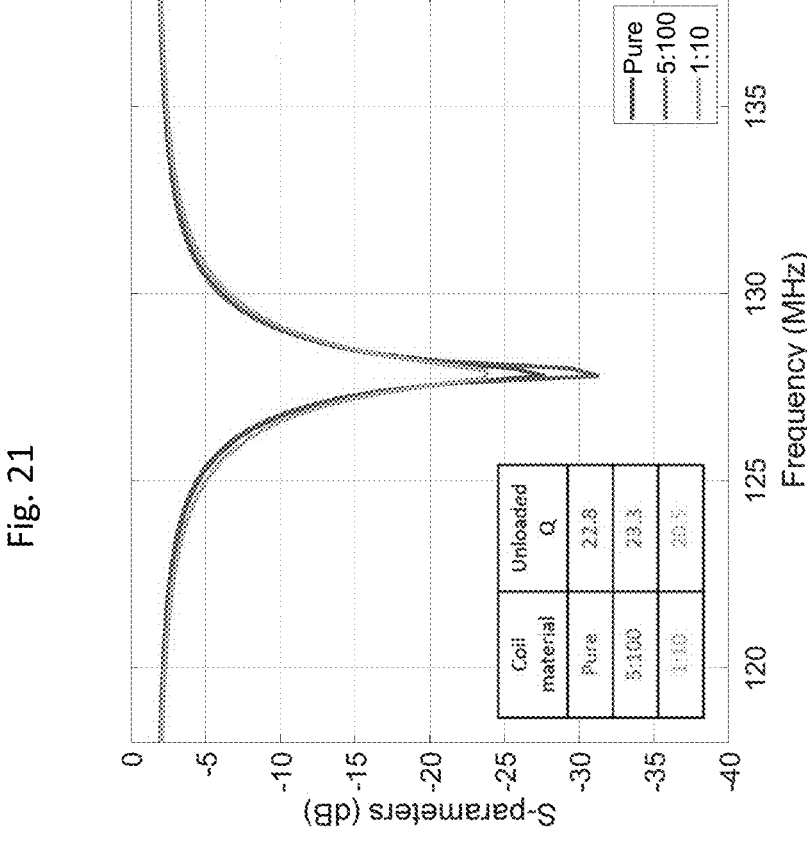
FIG. 21 illustrates results of three single coil elements with different dopant concentrations in accordance with aspects of the disclosure and the input impedance S11.

FIGS. 20G-20I illustrate signal intensity measured inside the phantom along a vertical line going through the center of each coil. The vertical lines are shown in FIGS. 20A-20C. FIG. 20G corresponds to FIG. 20A; FIG. 20H corresponds to FIG. 20B; and FIG. 20I corresponds to FIG. 20C. As can be seen in FIGS. 20G-20I, the dopant of the polymer with Magnevist does not interfere with the sensitivity of the element within the phantom. Only the sensitivity at the surface is affected (distance=0).

Therefore, if desired, the polymer may be doped to reduce the visibility of the element on the image without sacrificing sensitivity.

In the description and claims herein, the term "about" indicates that the value listed may be somewhat altered, as long as the alteration does not result in nonconformance of the process or device. For example, for some elements the term "about" can refer to a variation of ±0.1%, for other elements, the term "about" can refer to a variation of ±1% or ±10%, or any point therein. For example, the term about when used for a measurement in mm, may include +/0.1, 0.2, 0.3, etc., where the difference between the stated number may be larger when the state number is larger. For example, about 1.5 may include 1.2-1.8, where about 20, may include 19.0-21.0.

The terminology used herein is for the purpose of describing particular aspects only and is not intended to be limiting the scope of the disclosure and is not intended to be exhaustive. Many modifications and variations will be apparent to those of ordinary skill in the art without departing from the scope and spirit of the disclosure.

What is claimed is:

1. A RF coil for a magnetic resonance imaging (MRI) scanner comprising:

a first flexible conductive trace; and a second flexible conductive trace, one end of the first flexible conductive trace and a corresponding end of the second flexible conductive trace shaped to form an interdigital capacitor, respective other ends of the first flexible conductive trace and the second flexible conductive trace are connectable with the MRI scanner through one or more circuits including tuning/matching circuitry and a preamplifier, wherein the RF coil is stretchable by at least 30% in a first direction orthogonal to digits of the interdigital capacitor and change in resonance frequency under stretching of 30% is less than 2% from the resonance frequency of the RF coil not stretched.

2. The RF coil of claim 1, wherein the first flexible conductive trace and the second flexible conductive trace comprise a liquid metal formed in microchannels in a flexible polymer matrix.

3. The RF coil of claim 2, wherein the liquid metal contains gallium alloys.

4. The RF coil of claim 2, wherein the flexible polymer matrix comprises an elastomer.

5. The RF coil of claim 4, wherein the elastomer is doped with a contrast agent.

6. The RF coil of claim 5, wherein the contrast agent is gadolinium-based and wherein the elastomer is Ecoflex® and wherein the ratio between Ecoflex® and the contrast agent is such that the RF coil substantially invisible on an MR image.

7. The RF coil of claim 1, wherein the RF coil is wearable on a patient and wherein the RF coil is conformal to body parts selected from a group consisting of breast wall, chest wall, groin, neck, knee and shoulder.

8. The RF coil of claim 7, wherein the RF coil is configured to stretch with motion of a joint or body part.

9. The RF coil of claim 1, wherein a number of digits, gap between the one end of the first flexible conductive trace and the corresponding end of the second flexible conductive trace, and digit length are based on at least one of a patient size, coil size, a body part, expected motion or magnetic field of the scanner.

10. An RF coil for a magnetic resonance imaging (MRI) scanner comprising:

a plurality of flexible conductive traces comprising a first flexible conductive trace, a second flexible conductive trace and a third flexible conductive trace, one end of the first flexible conductive trace and a corresponding end of the second flexible conductive trace shaped to form a first interdigital capacitor, the other end of the second flexible conductive trace and a corresponding end of the third flexible conductive trace shaped to form a second interdigital capacitor, the first interdigital capacitor being orthogonal to the second interdigital capacitor;

the other end of the first flexible conductive trace connectable with the MRI scanner through one or more circuits including tuning/matching circuitry and a preamplifier; and the other end of the third flexible conductive trace being connectable with the MRI scanner through one or more circuits including tuning/matching circuitry and a preamplifier.

11. The RF coil of claim 10, where the RF coil is stretchable by at least 30% in a first direction orthogonal to digits of the first interdigital capacitor and in a second direction orthogonal to digits of the second interdigital capacitor.

12. The RF coil of claim 10, further comprising a fourth flexible conductive trace, one end of the fourth flexible conductive trace and the other end of the third flexible conductive trace shaped to form a third interdigital capacitor, wherein the other end of the fourth flexible conductive trace is connectable with the MRI scanner through one or more circuits including tuning/matching circuitry and a preamplifier.

13. A coil array comprising a plurality of coils, each of the plurality of coils comprising:

a first flexible conductive trace; and a second flexible conductive trace, one end of the first flexible conductive trace and a corresponding end of the second flexible conductive trace shaped to form an interdigital capacitor, respective other ends of the first flexible conductive trace and the second flexible conductive trace are connectable with the MRI scanner through one or more circuits including tuning/matching circuitry and a preamplifier, wherein the coil array is stretchable by at least 30% in a first direction orthogonal to digits of the interdigital capacitor in each coil and a change in resonance frequency under stretching of 30% is less than 2% from the resonance frequency of the coil array not stretched.

14. The coil array of claim 13, wherein the first flexible conductive trace and the second flexible conductive trace comprise a liquid metal formed in microchannels in a flexible polymer matrix.

15. The coil array of claim 14, wherein each coil is located in a same layer of the flexible polymer matrix or wherein the coils are arranged in a dual layer and adjacent coils are located in different layers of the dual layer.

16. The coil array of claim 13, wherein an interdigital capacitor in each coil is aligned with a corresponding interdigital capacitor in other coils.

17. The coil array of claim 13, wherein the coil array is wearable on a patient and wherein the coil array is conformal to body parts selected from a group consisting of breast wall, chest wall, groin, neck, knee and shoulder.

18. The coil array of claim 13, wherein adjacent coils overlap, wherein an amount overlap is set such that cross-talk between the adjacent coils is less than a preset threshold.

* * * * *